United States Patent
Yamaoka et al.

(10) Patent No.: US 9,466,346 B2
(45) Date of Patent: Oct. 11, 2016

(54) SEMICONDUCTOR DEVICE AND INFORMATION PROCESSING DEVICE

(71) Applicant: Hitachi Ltd., Tokyo (JP)

(72) Inventors: Masanao Yamaoka, Tokyo (JP); Chihiro Yoshimura, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 14/639,589

(22) Filed: Mar. 5, 2015

(65) Prior Publication Data
US 2016/0064053 A1  Mar. 3, 2016

(30) Foreign Application Priority Data

Aug. 29, 2014  (JP) .................. 2014-176238

(51) Int. Cl.
| | |
|---|---|
| *G06F 12/02* | (2006.01) |
| *G11C 7/22* | (2006.01) |
| *G11C 11/406* | (2006.01) |
| *G11C 11/411* | (2006.01) |
| *G06N 7/00* | (2006.01) |
| *G06N 99/00* | (2010.01) |

(52) U.S. Cl.
CPC ........... *G11C 7/222* (2013.01); *G06F 12/0246* (2013.01); *G06N 7/005* (2013.01); *G11C 11/40615* (2013.01); *G11C 11/411* (2013.01); *G06F 2212/7201* (2013.01); *G06N 99/002* (2013.01)

(58) Field of Classification Search
CPC .. G06F 12/0246; G11C 7/222; G11C 11/411
USPC .................................... 711/100, 103
See application file for complete search history.

(56) References Cited

U.S. PATENT DOCUMENTS

| | | | |
|---|---|---|---|
| 6,288,936 B1 * | 9/2001 | Kawamura | G11C 11/5621 365/185.03 |
| 9,331,695 B2 * | 5/2016 | Yoshimura | H03K 19/0002 |
| 2012/0066432 A1 * | 3/2012 | Miura | G06F 13/161 711/102 |
| 2013/0226540 A1 * | 8/2013 | Pita | G06F 17/5009 703/2 |
| 2014/0046626 A1 | 2/2014 | Yamamoto et al. | |

FOREIGN PATENT DOCUMENTS

| | | |
|---|---|---|
| JP | WO2012/118064 A1 | 9/2012 |
| JP | 2014-075065 A | 4/2014 |

* cited by examiner

*Primary Examiner* — Pierre-Michel Bataille
(74) *Attorney, Agent, or Firm* — Foley & Lardner LLP

(57) ABSTRACT

A semiconductor device has a plurality of units, each of which includes a first memory cell that stores a value indicating a state of one node of an interaction model, a second memory cell that stores an interaction coefficient indicating an interaction from a node connected to the one node, and a third memory cell that stores a bias coefficient of the one node. Furthermore, the semiconductor device has a computing circuit that determines a value indicating a next state of the one node based on a value indicating a state of the connected node, the interaction coefficient and the bias coefficient. Also, each of the second memory cell and the third memory cell in the plurality of units includes multi-valued memory cells.

11 Claims, 10 Drawing Sheets

SEMICONDUCTOR DEVICE AND INFORMATION PROCESSING DEVICE

CROSS-REFERENCE TO RELATED APPLICATION

The present application claims priority from Japanese Patent Application No. 2014-176238 filed on Aug. 29, 2014, the content of which is hereby incorporated by reference into this application.

TECHNICAL FIELD OF THE INVENTION

The present invention relates to a semiconductor device, and particularly relates to a semiconductor device that carries out the calculation of an interaction model and to an information processing device that controls the semiconductor device as an accelerator.

BACKGROUND OF THE INVENTION

Today, a mainstream of computer architectures is a von Neumann type. In the von Neumann architecture, the operation thereof is defined by a program which is a sequential instruction sequence. The architecture has versatility, that is, it can be used for various purposes by changing the program. Not only a CPU (Central Processing Unit) which plays main roles of a computer, but also a computing device for particular uses such as a GPU (Graphics Processing Unit) employs the von Neumann architecture, and the basic operation thereof is sequential executions of instruction sequences.

In the past, the performance improvement of computers has mainly depended on the improvement of clock frequencies. Since the foundation of the von Neumann architectures is sequential execution of instruction sequences, performance improvement can be expected if the execution speed of instructions is increased. However, in general-purpose CPUs used in personal computers and servers, the improvement of clock frequencies has reached a ceiling at around 3 GHz in the early 2000s. Recently, in place of the clock frequency which has reached a ceiling, the measures which realize the performance improvement by multicore parallel processing have become mainstream.

In the multicore parallel processing, performance is improved by finding out parts that can be executed in parallel from sequential instruction sequences (extraction of parallelism) and executing them in parallel. However, it is not easy to extract parallelism from a program in which sequential algorithms are written as instruction sequences. ILP (Instruction Level Parallelism) which extracts parallelism in an instruction level has already reached a limit, and there is recently a tendency that parallelism having lower granularity such as TLP (Thread Level Parallelism) or DLP (Data Level Parallelism) is used.

In view of such circumstances, in order to improve the performance of computers in the future, there is a need to make a transition to intrinsically parallel information processing instead of being based on the conventional execution of the sequential instruction sequences. For this purpose, instead of the conventional problem description method by sequential instruction sequences, problem descriptions suitable for realizing the intrinsically parallel information processing are required.

As a candidate therefor, various physical phenomena and social phenomena can be expressed by interaction models. The interaction model is a model defined by a plurality of nodes constituting the model, interactions between the nodes and, if needed, bias of each node. Various models have been proposed in physics and social sciences, and each of them can be interpreted as one aspect of the interaction model. Moreover, as a characteristic of the interaction model, the influence between nodes is limited to the interaction between two nodes (interaction between two bodies). For example, if the mechanics of planets in the outer space is considered, this can be interpreted as one type of the interaction model in the point that there are interactions caused by universal gravitation among nodes such as planets. However, the influence among the planets is not limited to that between two planets, and three or more planets are mutually affected and exhibit complex behavior (causing a so-called 3-body problem or multi-body problem).

In the world of physics, typical examples of interaction models include an Ising model. The Ising model is a model of statistical mechanics for describing the behavior of magnetic bodies and is used in research of magnetic bodies. The Ising model is defined as interactions between sites (spins taking two values of +1 and −1). It is known that obtaining a ground state of an Ising model whose topology becomes a non-planar graph is an NP-hard problem. Since the Ising model expresses a problem by interaction coefficients spread in spatial directions, there is a possibility that information processing using intrinsic parallelism can be realized.

Incidentally, since obtaining the ground state of the Ising model is an NP-hard problem as described above, it is difficult in terms of calculation time to solve that by a von Neumann computer. An algorithm that increases the speed by introducing the heuristic has also been proposed. However, there has been proposed a method in which the ground state of the Ising model is obtained at high speed by the calculations using physical phenomena more directly, in other words, by an analog computer instead of the von Neumann computer. For example, a device described in International Publication No. 2012/118064 (Patent Document 1) has been known as such a device.

SUMMARY OF THE INVENTION

In the device described in the Patent Document 1, the types of the coefficient values corresponding to a problem to be solved are limited. Also in the case of an Ising model, the interaction coefficients of spins are limited only to two values of +1 and −1, which therefore leads to the limitation of the types of the Ising model. Thus, it is desired to have further multi-valued coefficients, which are not limited by the type of the Ising model.

A typical object of the present invention is to provide a technique that enables the interaction calculations using the multi-valued coefficients of three or more values in a semiconductor device that carries out the calculation of an interaction model.

The above and other objects and novel characteristics of the present invention will be apparent from the description of the present specification and the accompanying drawings.

The following is a brief description of an outline of the typical invention disclosed in the present application.

A typical semiconductor device has a plurality of units, each of which includes a first memory cell that stores a value indicating a state of one node of an interaction model, a second memory cell that stores an interaction coefficient indicating an interaction from a node connected to the one node, and a third memory cell that stores a bias coefficient of the one node. Furthermore, it has a computing circuit that determines a value indicating a next state of the one node based on a value indicating a state of the connected node, the interaction coefficient and the bias coefficient. Then, each of the second memory cell and the third memory cell in the plurality of units includes multi-valued memory cells.

For example, the multi-valued memory cells are memory cells of a flash memory. Preferably, a numerical value of the interaction coefficient stored in the second memory cell and a numerical value of the bias coefficient stored in the third memory cell are stored in the memory cells of the flash memory. Alternatively, a numerical value and a sign of the interaction coefficient stored in the second memory cell and a numerical value and a sign of the bias coefficient stored in the third memory cell are stored in the memory cells of the flash memory.

The effects obtained by typical embodiments of the invention disclosed in the present application will be briefly described below.

A typical effect is that it is possible to provide the technique that enables the interaction calculations using the multi-valued coefficients of three or more values in a semiconductor device that carries out the calculation of an interaction model.

BRIEF DESCRIPTIONS OF THE DRAWINGS

DESCRIPTIONS OF THE PREFERRED EMBODIMENTS

Figure 1:
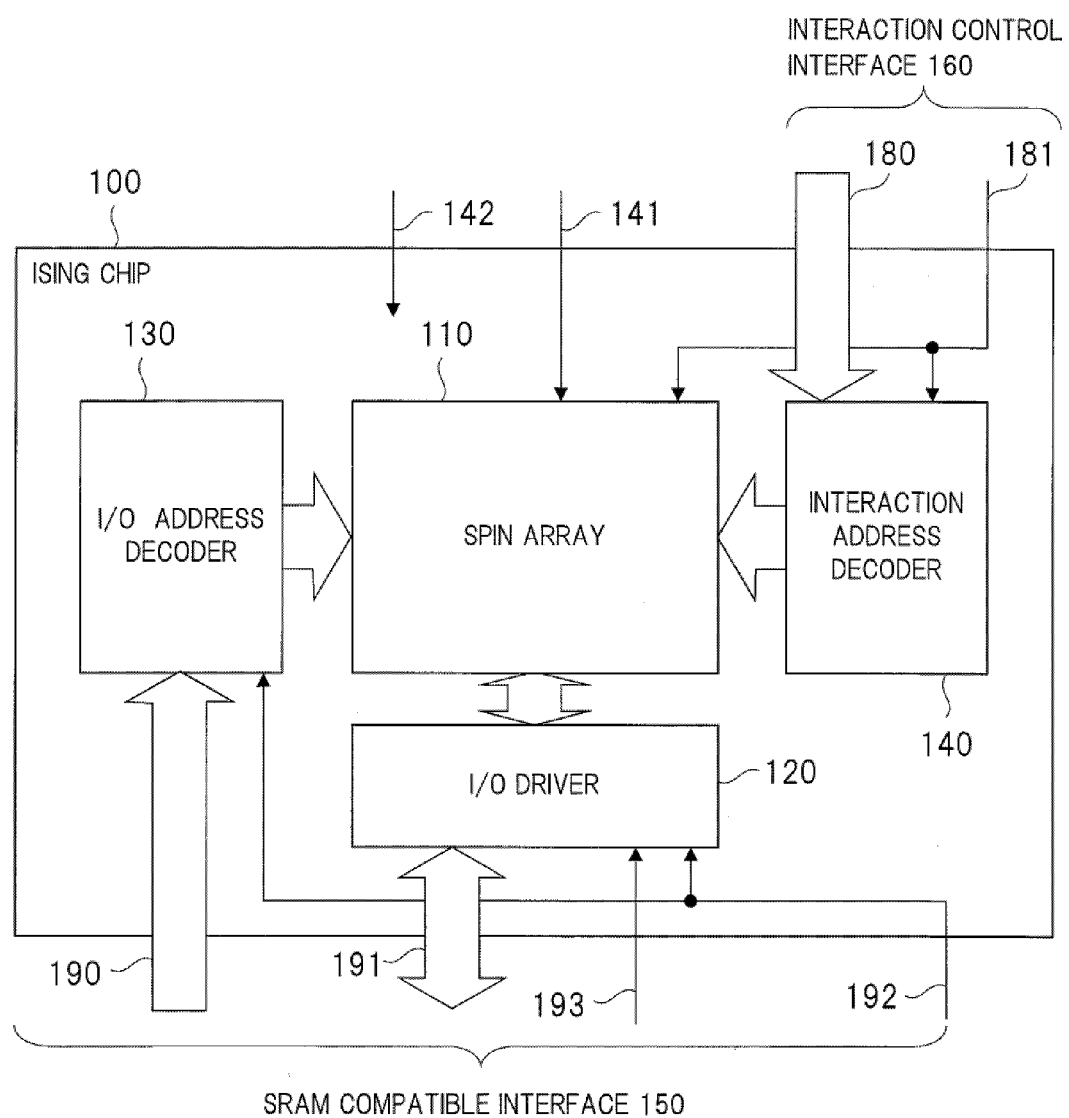
FIG. 1 is a drawing for describing an example of the configuration of an Ising chip in an embodiment of the present invention.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable.

Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, embodiments of the present invention will be described in detail based on drawings. Note that components having the same function are denoted by the same reference characters throughout the drawings for describing the embodiments, and the repetitive description thereof is omitted. In addition, the description of the same or similar portions is not repeated in principle unless particularly required in the following embodiments.

First Embodiment

The present embodiment relates to a semiconductor device which carries out calculations of an interaction model and an information processing device which controls the semiconductor device as an accelerator.

<0. Definition of Interaction Model>

Various physical phenomena and social phenomena can be expressed by interaction models. The interaction model is a model defined by a plurality of nodes constituting the model, interactions between the nodes and, if needed, bias of each node. Various models have been proposed in physics and social sciences, and each of them can be interpreted as an aspect of the interaction model. Moreover, as a characteristic of the interaction model, the influence between nodes is limited to the interaction between two nodes (interaction between two bodies). For example, if the mechanics of planets in the outer space is considered, this can be interpreted as a type of the interaction model in the point that there are interactions caused by universal gravitation among nodes such as planets. However, the influence among the planets is not limited to that between two planets, and three or more planets are mutually affected and exhibit complex behavior (causing a so-called 3-body problem or multi-body problem).

In the world of physics, typical examples of interaction models include an Ising model. The Ising model employs the spins which are in two states of +1 and −1 (or up and down and the like) as nodes and defines a model by an interaction coefficient, which determines the interaction between the two spins, and an external magnetic field coefficient, which is the bias for the individual spins. Moreover, in the world of biology, a neural network which has been modeled after the brain is an example of the interaction model. The neural network employs artificial neurons, which are modeled after neurons of nerve cells, as nodes and has interactions called synaptic coupling between the artificial neurons. Moreover, each neuron is biased in some cases. In the world of social sciences, for example, if human communication is considered, it could be easily understood that there are nodes such as humans and interactions made by language and communication. Moreover, it is also conceivable that each human is individually biased. Therefore, there has also been research to convert the human communication into an Ising model which is similar in terms of being the interaction model, thereby revealing the characteristics thereof.

Hereinafter, an example of an Ising chip 100 (FIG. 1) which is a semiconductor device for obtaining a ground state of an Ising model and an information processing device 200 (FIG. 2) which controls the Ising chip 100 will be described.

<1. Conversion of Problem to be Solved into Ground State Search Problem of Ising Model>

An Ising model is a model of statistical mechanics for describing the behavior of magnetic bodies. The Ising model is defined by spins taking two values of +1 and −1 (or 0 and 1, up and down), an interaction coefficient indicating the interactions between the spins and an external magnetic field coefficient which is present for each spin.

The Ising model can calculate the energy at that moment from a given spin arrangement, interaction coefficient and external magnetic field coefficient. An energy function E(σ) of the Ising model is generally expressed by the following equation (1).

[Equation 1]

$$E(\sigma) = -\sum_{\langle i,j \rangle} J_{i,j} \sigma_i \sigma_j - \sum_i h_i \sigma_i \quad (1)$$

Note that $\sigma_i$ and $\sigma_j$ represent the values of i-th and j-th spins, respectively, $J_{i,j}$ represents an interaction coefficient between the i-th and j-th spins, $h_i$ represents an external magnetic field coefficient with respect to the i-th spin, $\langle i,j \rangle$ represents a combination of mutually adjacent two sites, and σ represents an arrangement of spins.

Obtaining the ground state of the Ising model is an optimization problem of obtaining the arrangement of the spins that minimizes the energy function of the Ising model. For example, problems such as factorization, a traveling salesman problem, etc. which are the problems apparently irrelevant to magnetic bodies can be converted into Ising models. Also, the ground states of the Ising models obtained by the conversions correspond to the solutions of the original problems. Therefore, it can be said that a device that can search for the ground state of the Ising model is a computer which can be used for general purposes.

<2. Configuration of Ising Chip>

FIG. 1 is a drawing for describing an example of the configuration of the Ising chip 100 in the present embodiment. The Ising chip 100 is made up of a spin array 110, an I/O (Input/Output) driver 120, an I/O address decoder 130 and an interaction address decoder 140. In the present embodiment, the Ising chip 100 is described on the assumption that it is implemented as a CMOS (Complementary Metal-Oxide Semiconductor) integrated circuit which is widely used today, but it can be realized also as another solid-state component.

The Ising chip 100 has an SRAM compatible interface 150 for the reading from and writing to the spin array 110, and the SRAM compatible interface 150 is made up of an address bus 190, a data bus 191, a R/W control line 193 and an I/O clock line 192. Furthermore, in the present embodiment, in addition to the SRAM compatible interface, a flash memory compatible interface (FIG. 12 to FIG. 15) to be described later is also provided. Moreover, as an interaction control interface 160 for controlling the ground state search of an Ising model, an interaction address line 180 and an interaction clock line 181 are provided. The Ising chip 100 is normally operated by a voltage supplied by a power line 142, while a part of the spin array 110 is operated by a voltage supplied by a spin power line 141. Specifically, among the memory cells possessed by a spin unit 300 (FIG. 3) constituting the spin array 110, the memory cell retaining spin information is operated by the voltage supplied by the spin power line 141.

In the Ising chip 100, all of the spin $\sigma_i$, the interaction coefficient $J_{i,j}$ and the external magnetic field coefficient $h_i$ of the Ising model are expressed by the information stored in the memory cells in the spin array 110. In order to set an initial state of the spin $\sigma_i$ and read a solution after the ground state search is completed, read and write of the spin $\sigma_i$ are carried out by the SRAM compatible interface 150. Moreover, in order to set the Ising model, the ground state of which is to be searched, to the Ising chip 100, read and write of the interaction coefficient $J_{i,j}$ and the external magnetic field coefficient $h_i$ are also carried out by the SRAM compatible interface 150 and the flash memory compatible interface. Therefore, addresses are given to the spin $\sigma_i$, the interaction coefficient $J_{i,j}$ and the external magnetic field coefficient $h_i$ in the spin array 110.

Note that the address bus 190, the data bus 191, and the R/W control line 193 constituting the SRAM compatible interface 150 are operated in synchronization with a clock signal input to the I/O clock line 192. However, in the present invention, the interface is not required to be a synchronous interface, but may be an asynchronous interface. The present embodiment is described on the assumption that it is a synchronous interface.

Moreover, the Ising chip 100 realizes interactions between the spins in the spin array 110 in order to carry out the ground state search. It is the interaction control interface 160 that controls the interactions from outside. Specifically, an address specifying a spin group which carries out interactions is input via the interaction address line 180, and the interactions are carried out in synchronization with the clock signal input via the interaction clock line 181.

Note that the interactions are not necessarily required to be realized by a clock synchronous circuit, but may be realized by an asynchronous circuit. In this case, the role of the interaction clock line 181 is not the inputting of the clock signal, but the inputting of an enable signal which allows execution of the interactions. The interaction control interface is also not necessarily required to be a synchronous interface, but may be an asynchronous interface. However, the present embodiment is described on the assumption that a synchronous interface is used and the interactions are carried out in synchronization with the clock signal input via the interaction clock line 181.

<3. Configuration of Information Processing Device>

Information processing is realized by using one or a plurality of Ising chips 100 described above, and the interfaces as described above have to be controlled for this purpose. Therefore, the Ising chip 100 is used as a part of the information processing device 200 as shown in FIG. 2.

Figure 2:
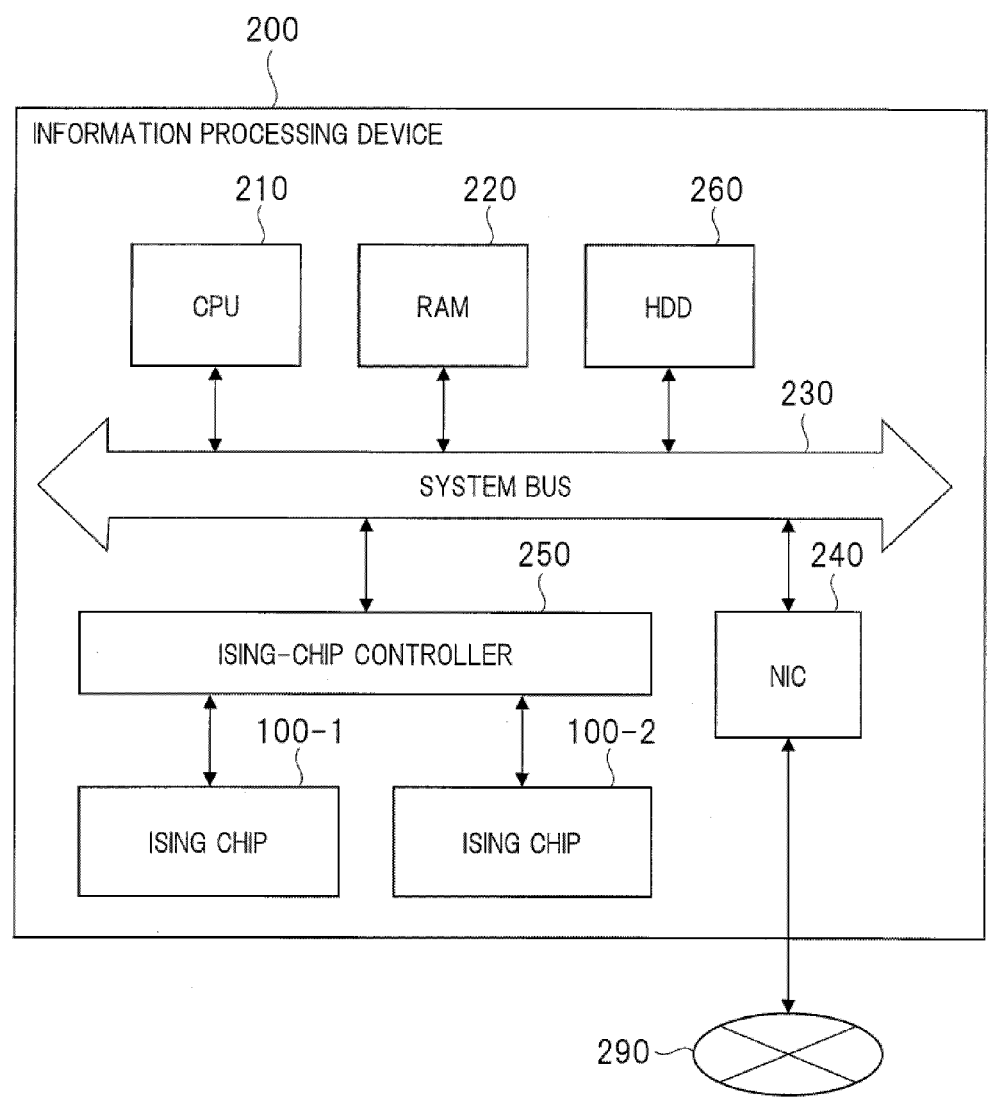
FIG. 2 is a drawing for describing an example of the configuration of an information processing device in the embodiment of the present invention.

FIG. 2 is a drawing for describing an example of the configuration of the information processing device 200 in the present embodiment. The information processing device 200 may be regarded as a device obtained by installing an accelerator composed of the Ising chips 100 to a personal computer or a server that is generally used today. The information processing device 200 includes a CPU (Central Processing Unit) 210, a RAM (Random Access Memory) 220, a HDD (Hard Disk Drive) 260, a NIC (Network Interface Card) 240 and others, and these are coupled by a system bus 230. This is a configuration generally found in a personal computer or a server of today.

In addition, an Ising-chip controller 250 is connected to the system bus 230, and one or a plurality of Ising chips (in the example of FIG. 2, two Ising chips 100-1 and 100-2) are provided ahead of it. Hereinafter, if there is no particular need to distinguish the two Ising chips, they are simply referred to as Ising chips 100. The Ising-chip controller 250 and the Ising chip 100 correspond to the accelerator and are used as, for example, an expansion card inserted into a peripheral-expansion interface such as PCI Express. The Ising-chip controller 250 converts a protocol of the system bus 230 (for example, PCI Express or QPI) in accordance with the interface of the Ising chip 100.

Software which is operated on the CPU 210 of the information processing device 200 can control the Ising chips 100 via the Ising-chip controller 250 generally by carrying out read and write with respect to a particular address. Moreover, a plurality of such information processing devices 200 may be coupled and used via an inter-device network 290.

In the information processing device 200, the CPU 210 controls the Ising-chip controller 250 and the Ising-chip controller 250 controls the SRAM compatible interface 150, the flash memory compatible interface and the interaction control interface 160 of the Ising chip 100, thereby realizing the ground state search of an Ising model.

<4. Configuration of Spin Array>

Figure 3:
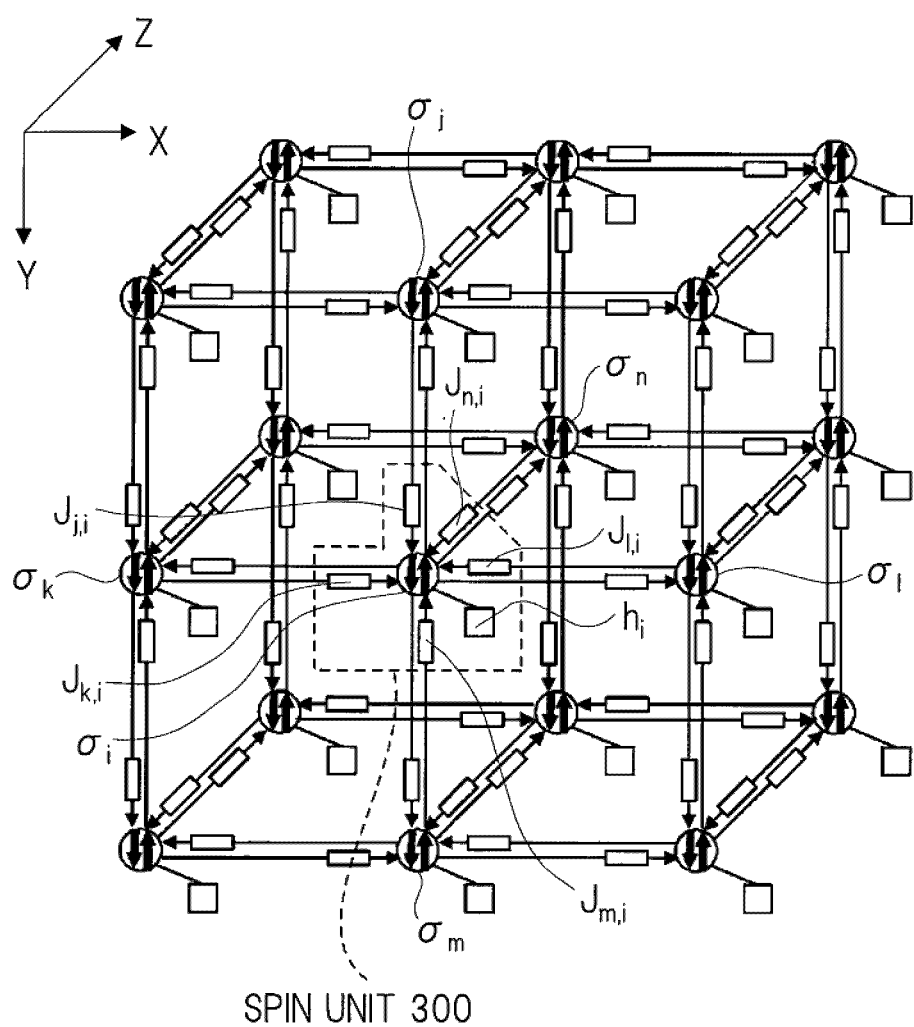
FIG. 3 is a drawing for describing an example of the configuration of a spin array of a three-dimensional lattice in the embodiment of the present invention.

In the spin array 110, a spin unit 300 by which the retention of one spin, an interaction coefficient and an external magnetic field coefficient associated with the spin and the ground state searching process are realized is used as a basic constituent unit, and the spin array 110 is formed by arranging a large number of the spin units 300. FIG. 3 is a drawing for describing an example of the configuration of the spin array 110 of a three-dimensional lattice. FIG. 3 shows an example in which an Ising model having three-dimensional lattice topology is formed by arranging the plurality of spin units 300. The example of FIG. 3 is a three-dimensional lattice having a size of 3 (X-axis direction)×3 (Y-axis direction)×2 (Z-axis direction). The definition of coordinate axes is as shown in the drawing. Namely, the rightward direction in the drawing is an X axis, the downward direction in the drawing is a Y axis, and the depth direction in the drawing is a Z axis. However, these coordinate axes are required only for the sake of convenience for describing the embodiment and are not relevant to the present invention. In the case in which topology other than a three-dimensional lattice such as tree-shaped topology is used, it is expressed by, for example, the number of levels of the tree separately from the coordinate axes. In the three-dimensional lattice topology of FIG. 3, when the interactions between the spins are captured as a graph, a spin (vertex) having a degree of 5 is required at most. If the connection of an external magnetic field coefficient is also taken into consideration, a degree of 6 is required at most.

To the one spin unit 300 shown in FIG. 3, the values of adjacent spins (for example, when the number of adjacent spins is five) $\sigma_j$, $\sigma_k$, $\sigma_l$, $\sigma_m$ and $\sigma_n$ are input. Moreover, the spin unit 300 has memory cells which retain a spin $\sigma_i$, an external magnetic field coefficient $h_i$ and $J_{j,i}$, $J_{k,i}$, $J_{l,i}$, $J_{m,i}$ and $J_{n,i}$ (coefficients of the interactions with adjacent 5 spins) which are the interaction coefficients with respect to the above-described adjacent spin $\sigma_i$.

Incidentally, an Ising model generally has the interactions which are expressed by an undirected graph. The above-described equation (1) includes $J_{i,j} \times \sigma_i \times \sigma_j$ as a term expressing an interaction, and this indicates the interaction from the i-th spin to the j-th spin. Herein, in a general Ising model, the interaction from the i-th spin to the j-th spin and the interaction from the j-th spin to the i-th spin are not distinguished from each other. In other words, $J_{i,j}$ and $J_{j,i}$ are the same. However, in the Ising chip 100 of the present embodiment, this Ising model is expanded to a directed graph, by which the interaction from the i-th spin to the j-th spin and the interaction from the j-th spin to the i-th spin can be made asymmetric. In this manner, the expression ability of the model is enhanced, and many problems can be expressed by smaller-scale models.

Therefore, when the one spin unit 300 is assumed as the i-th spin $\sigma_i$, $J_{j,i}$, $J_{k,i}$, $J_{l,i}$, $J_{m,i}$ and $J_{n,i}$ which are the interaction coefficients retained by the spin unit determine the interactions from the adjacent j-th, k-th, l-th, m-th" and n-th spins $\sigma_j$, $\sigma_k$, $\sigma_l$, $\sigma_m$ and $\sigma_n$ to the i-th spin $\sigma_i$. This corresponds to the fact that the arrows (interactions) corresponding to the interaction coefficients included in the spin unit 300 are directed from the spins outside the illustrated spin unit 300 toward the spin inside the spin unit 300 in FIG. 3.

<5. Correspondence Relation between Topology of Spin Array and Memory Cells in Spin Unit>

An example of the configuration of the spin unit 300 will be described with reference to FIG. 6. In order to retain the spin $\sigma_i$, the interaction coefficients $J_{j,i}$ to $J_{n,i}$ and the external magnetic field coefficient $h_i$ of the Ising model, the spin unit 300 is provided with a plurality of 1-bit memory cells N0, ISS (illustration thereof is omitted), ISV (illustration thereof is omitted), IUS, IUV, ILS (illustration thereof is omitted), ILV (illustration thereof is omitted), IRS (illustration thereof is omitted), IRV (illustration thereof is omitted), IDS, IDV, IFS (illustration thereof is omitted) and IFV (illustration thereof is omitted). Note that, since each of the illustration-omitted memory cells ISS and ISV, the memory cells IUS and IUV, the illustration-omitted memory cells ILS and ILV, the illustration-omitted memory cells IRS and IRV, the memory cells IDS and IDV, and the illustration-omitted memory cells IFS and IFV plays a role in pairs, they are collectively abbreviated as memory cell pairs ISx, IUx, ILx, IRx, IDx and IFx (see FIG. 4). Hereinafter, the memory cells with the inclusion of those omitted in illustration will be described.

Among the memory cells N0, ISS, ISV, IUS, IUV, ILS, ILV, IRS, IRV, IDS, IDV, IFS and IFV possessed by the spin unit 300, the memory cells NO, ISS, IUS, ILS, IRS, IDS and IFS are memory cells of a SRAM 310. ISV, IUV, ILV, IRV, IDV and IFV are memory cells of a flash memory 320.

Although it is not illustrated, the memory cell of the SRAM 310 possessed by the spin unit 300 has a data retaining unit composed of two CMOS inverters, and by controlling pass-gate transistors which are connected to both ends thereof by word lines and bit lines, read and write of data from/to the data retaining unit is realized. Read and write of data from/to the memory cells of the flash memory 320 will be described later with reference to FIG. 12 to FIG. 15 and others.

Herein, descriptions will be given on the assumption that the spin unit 300 expresses the i-th spin. The memory cell NO is a memory cell for expressing the spin $\sigma_i$ and retains the value of the spin. The values of the spin are +1 and −1 (+1 may be expressed as up and −1 may be expressed as down) in an Ising model, and these are made to correspond to two values of a memory cell such as 0 and 1. For example, +1 is made to correspond to 1, and −1 is made to correspond to 0.

Figure 4:
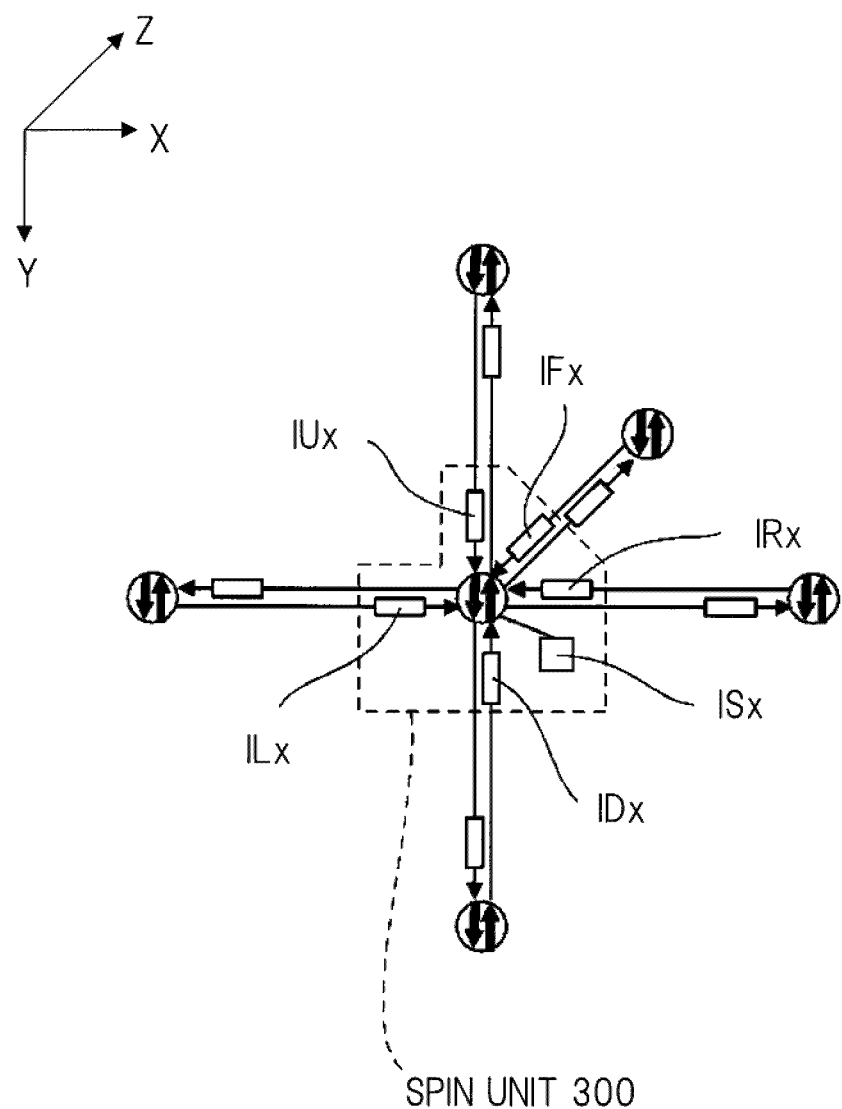
FIG. 4 is a drawing for describing an example of the correspondence relation between topology of the spin array and memory cells in a spin unit in the embodiment of the present invention.

With reference to FIG. 4, an example of the correspondence relation between the memory cell pairs ISx, IUx, ILx, IRx, IDx and IFx possessed by the spin unit 300 and the topology of the Ising model shown in FIG. 3 is shown. The memory cell pair ISx stores the external magnetic field coefficient. Moreover, the memory cell pairs IUx, ILx, IRx, IDx and IFx store the interaction coefficients, respectively. Specifically, the memory cell pair IUx stores the interaction coefficient J with respect to the upper-side spin (−1 in the Y-axis direction), the memory cell pair ILx stores the interaction coefficient J with respect to the left-side spin (−1 in the X-axis direction), the memory cell pair IRx stores the interaction coefficient J with respect to the right-side spin (+1 in the X-axis direction), the memory cell pair IDx stores the interaction coefficient J with the lower-side spin (+1 in the Y-axis direction), and the memory cell pair IFx stores the interaction coefficient J with respect to the spin connected in the depth direction (+1 or −1 in the Z-axis direction), respectively.

Moreover, in the case in which the Ising model is captured as a directed graph, when viewed from a certain spin, the other spins have coefficients of the influence exerted on its own spin. The coefficients of the influence exerted from its own spin onto the other spins belong to the other spins. Namely, the spin unit 300 is connected to five spins at most. In the Ising chip 100 of the present embodiment, the external magnetic field coefficient and the interaction coefficients are applied as multiple values. The values from 0 to 1 can be taken as the multiple values. For example, the five values of +1, +0.5, 0, −0.5 and −1 are conceivable, but the values are not limited thereto. Therefore, in order to express the external magnetic field coefficient and the interaction coefficients, multi-valued memory cells are required, respectively. In each of the memory cell pairs ISx, IUx, ILx, IRx, IDx and IFx, for example, the five values of +1, +0.5, 0, −0.5 and −1 are expressed by the combination of the two memory cells having last symbols of S and V (for example, in the case of the memory cell pair ISx, the memory cells ISS and ISV).

For example, in the case of the memory cell pair ISx, the memory cell ISS expresses +1 and −1, and +1 is expressed when the value retained by the memory cell ISV is 1 and −1 is expressed when the value retained by the memory cell ISV is 0. In addition to that, when the value retained by the memory cell ISS is 0, the external magnetic field coefficient is regarded as 0, and when the value retained by the memory cell ISS is 1, any of +1, +0.5, −0.5 and −1 determined by the value retained by the memory cell ISV serves as the external magnetic field coefficient. If the external magnetic field coefficient is considered to be disabled when the external magnetic field coefficient is 0, it can be said that the value retained in the memory cell ISS is an enable bit of the external magnetic field coefficient (the external magnetic field coefficient is enabled when ISS=1). The memory cell pairs IUx, ILx, IRx, IDx and IFx which store the interaction coefficients also cause the coefficients and the values of bits to correspond to each other in the same manner.

Each of the memory cells NO, ISS, ISV, IUS, IUV, ILS, ILV, IRS, IRV, IDS, IDV, IFS and IFV in the spin unit 300 has to be readable and writable from the outside of the Ising chip 100. For this reason, the spin unit 300 has a bit line and a word line (not shown) for the memory cells of the SRAM 310. By arranging the spin units 300 like tiles on a semiconductor substrate, connecting the bit lines and the word lines, and performing the driving, control or reading by the I/O address decoder 130 and the I/O driver 120 shown in FIG. 1, read and write of the memory cells of the SRAM 310 can be carried out by the SRAM compatible interface 150 like a general SRAM (Static Random Access Memory). Moreover, for the memory cells of the flash memory 320, read and write can be carried out by the flash memory compatible interface described later like a general flash memory.

<6. Circuit for Determining Next State of Spin in Spin Unit>

Each of the spin units 300 independently has a circuit for determining a next state of a spin by calculating interactions in order to carryout update at the same time. FIG. 6 shows the circuit for determining the next state of the spin.

Figure 6:
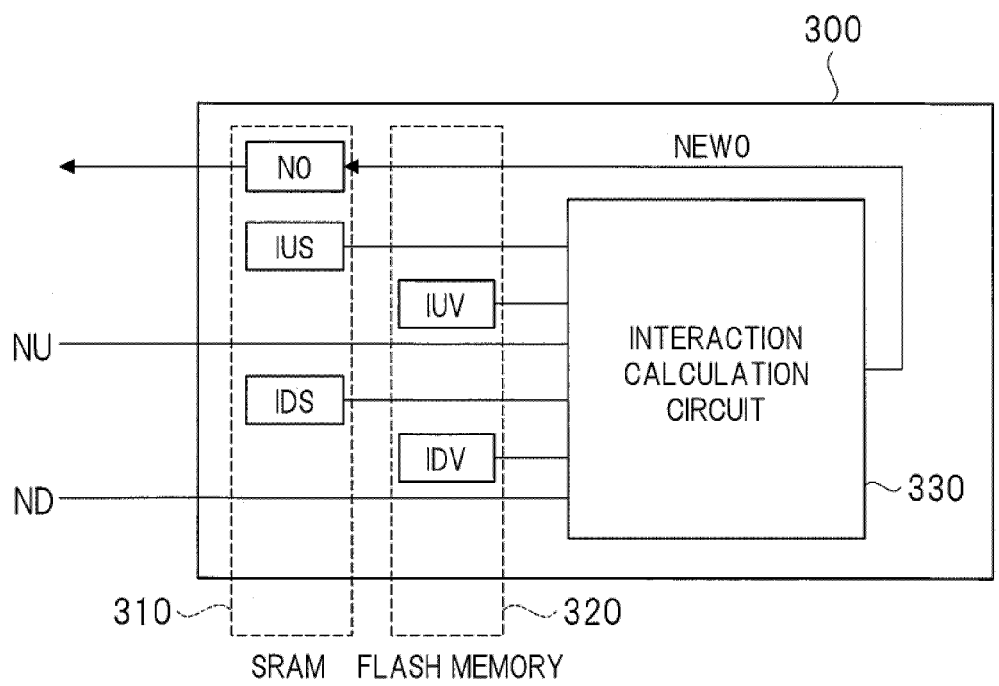
FIG. 6 is a drawing for describing an example of the configuration of the spin unit in the spin array of the Ising chip of FIG. 1.

In FIG. 6, the spin unit 300 has signal lines NU, NL (illustration thereof is omitted), NR (illustration thereof is omitted), ND, NF (illustration thereof is omitted) and NO as interfaces with outside. Hereinafter, the signal lines with the inclusion of those omitted in illustration will be described.

The signal line N0 is an interface, which outputs the value of the spin of this spin unit 300 to another spin unit 300. The signal lines NU, NL, NR, ND and NF are the interfaces for inputting the values of the spins respectively possessed by the other spin units 300. The signal line NU is an input from the upper-side spin (−1 in the Y-axis direction), the signal line NL is an input from the left-side spin (−1 in the X-axis direction), the signal line NR is an input from the right-side spin (−1 in the X-axis direction), the signal line ND is an input from the lower-side spin (+1 in the Y-axis direction), and the signal line NF is an input from the spin connected in the depth direction (+1 or −1 in the Z-axis direction).

Regarding these interfaces, when considering the topology of the Ising model, processing for ends has to be determined. If the ends are simply terminated like the topology of FIG. 3, there is no need to input anything to those corresponding to the ends of the signal lines NU, NL, NR, ND and NF (appropriate processing is employed as unused input terminals, for example, they are connected to a fixed value of 0 or 1 in terms of circuit).

In the spin unit 300, the next state of the spin is determined so as to minimize the energy between the spin unit 300 and the adjacent spins, and this is equivalent to judging which one of the positive (plus (+)) side value and the negative (minus (−)) side value is dominant when checking the products of the adjacent spins and the interaction coefficients and the external magnetic field coefficient. In the present embodiment, the judging is carried out by, for example, five values of +1, +0.5, 0, −0.5 and −1 as the multiple values. However, in order to facilitate understanding, the example based on +1 on the plus side, 0, and −1 on the minus side will be specifically described. However, in the case of five values like the example of the present embodiment, +1 on the plus side sometimes turns to +0.5 and −1 on the minus side sometimes turns to −0.5.

For example, in the case in which the spins $\sigma_j$, $\sigma_k$, $\sigma_l$, $\sigma_m$ and $\sigma_n$ are adjacent to the i-th spin $\sigma_i$, the next state of the spin $\sigma_i$ is determined in the following manner. First, the values of the adjacent spins are assumed to be $\sigma_j=+1$, $\sigma_k=-1$, $\sigma_l=+1$, $\sigma_m=-1$ and $\sigma_n=+1$, the interaction coefficients are assumed to be $J_{j,i}=+1$, $J_{k,i}=+1$, $J_{l,i}=+1$, $J_{m,i}=-1$ and $J_{n,i}=-1$ and the external magnetic field coefficient is assumed to be $h_i=+1$. At this time, when the products of the interaction coefficients and the adjacent spins and the external magnetic field coefficient in this case are arranged, $\sigma_j \times J_{j,i}=+1$, $\sigma_k \times J_{k,i}=-1$, $\sigma_l \times J_{l,i}=+1$, $\sigma_m \times J_{m,i}=+1$, $\sigma_n \times J_{n,i}=-1$ and $h_i=+1$ are obtained. The external magnetic field coefficient can be read as the interaction coefficient with respect to the spin which always has a value of +1.

Herein, the local energy between the i-th spin and the adjacent spins is obtained by multiplying the above-described coefficients respectively by the value of the i-th spin and further inverting the sign thereof. For example, since the local energy between the i-th spin and the j-th spin becomes −1 when the i-th spin is set to +1 and becomes +1 when the i-th spin is set to −1, it works in the direction of reducing the local energy therein by setting the i-th spin to +1. When considering such local energy for all of the adjacent spins and the external magnetic field coefficient, calculations are made as to which of the cases in which the i-th spin is set to +1 and −1 can reduce the energy more. This can be carried out by judging which one of +1 on the plus side and −1 on the minus side has larger action in the above-described arrangement of the products of the interaction coefficients and the adjacent spins and the external magnetic field coefficient. In the above-described example, there are four +1 and two −1 and the action of +1 is larger. If the i-th spin is +1, the sum total of the energy becomes −2, and if the i-th spin is −1, the sum total of the energy becomes +2. Therefore, by the interaction calculation of setting the next state of the i-th spin to +1 when the action of +1 is larger and setting the next state of the i-th spin to −1 when the action of −1 is larger, the next state of the i-th spin that minimizes the energy can be determined.

An interaction calculation circuit 330 shown in the spin unit 300 of FIG. 6 is a circuit for carrying out the above-described interactions. First, exclusive OR of the states of the adjacent spins and the values retained by the memory cells IUS, ILS (illustration thereof is omitted), IRS (illustration thereof is omitted), IDS and IFS (illustration thereof is omitted) which indicate +1 or −1 of the interaction coefficient is obtained. As a result, the next state of the spin that minimizes the energy when only the interactions thereof are taken into consideration can be calculated (it is assumed that +1 is encoded to 1 and −1 is encoded to 0). If the interaction coefficients are only +1 and −1, the next state of the spin can be determined by judging which one of +1 and −1 has larger action in the outputs of the exclusive OR by the interaction calculation circuit 330. If the external magnetic field coefficient is considered to correspond to the interaction coefficient with respect to the spin that always has a state of +1, the value of the external magnetic field coefficient simply becomes a value to be input to the interaction calculation circuit 330 which determines the next state of the spin.

In the configuration of the spin unit 300 shown in FIG. 6, the memory cells of the SRAM 310, the memory cells of the flash memory 320 and the interaction calculation circuit 330 are inclusively referred to as an interaction calculating circuit.

The above-described energy minimization by the interactions between the spins can realize the ground state search of the applied Ising model. However, this alone could result in a local optimal solution. Basically, since there is only the movement in the direction of reducing the energy, if it once results in a local optimal solution, it is not possible to get out from there and reach a global optimal solution. Therefore, as the action for escaping from the local optimal solution, a method of stochastically inverting the values of the memory cells expressing the spins is also used.

<7. Configuration of Spin Unit in Spin Array>

Figure 5:
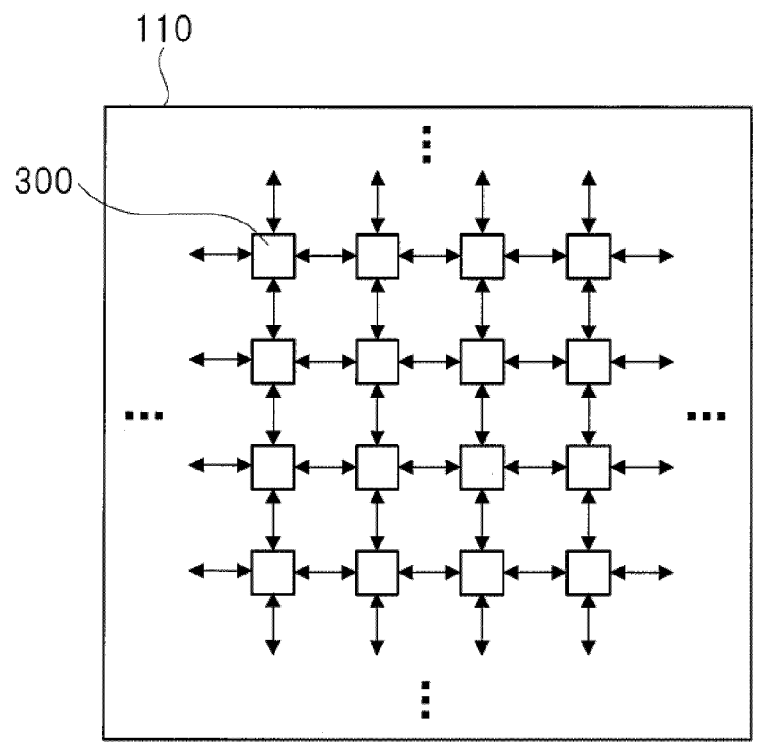
FIG. 5 is a drawing for describing an example of the interactions by spin units which are constituent units in the spin array of the Ising chip of FIG. 1.

FIG. 5 is a drawing for describing an example of the interactions by the spin units 300 which are the constituent units in the spin array 110. FIG. 5 shows the spin array 110 formed by arranging and connecting the plurality of spin units 300 on a two-dimensional plane on the semiconductor substrate in a state in which the topology of the Ising model is maintained. More specifically, in the spin array 110, the plurality of spin units 300 to which the spins of the Ising models having the three-dimensional lattice topology shown in FIG. 3 are allocated are arranged and connected in a two-dimensional lattice pattern on the semiconductor substrate.

In the example of FIG. 5, in the spin array 110, each of the spin units 300 is connected to the adjacent spin units which exert interactions thereon. Specifically, when focusing on a certain spin unit 300, this spin unit is connected to the upper-side spin unit, the left-side spin unit, the right-side spin unit and the lower-side spin unit. By virtue of such connection, each of the spin units 300 outputs the spin values of its own spin unit from its own spin unit to the adjacent spin units. Moreover, each of the spin units 300 receives inputs of the spin values of the adjacent spin units to its own spin unit from the adjacent spin units.

<8. Configuration of Spin Unit>

FIG. 6 is a drawing for describing an example of the configuration of the spin unit 300. The spin unit 300 has the memory cell NO which stores the value of one spin of an Ising model, the memory cells IUS, IUV, IDS and IDV (other illustration-omitted ILS, ILV, IRS, IRV, IFS and IFV) which store the interaction coefficients from the adjacent spins which exert interactions on the one spin, the memory cells (illustration-omitted ISS and ISV) which store the external magnetic field coefficient of the one spin, and the interaction calculation circuit 330 which determines the next state of the one spin by the interaction calculation of the products of the values of the adjacent spins and the interaction coefficients corresponding thereto and the external magnetic field coefficient.

Among the memory cells which store the interaction coefficients, IUS, IDS, ILS, IRS and IFS are the memory cells which store signs. Among the memory cells which store the interaction coefficients, IUV, IDV, ILV, IRV and IFV are the memory cells which store numerical values. Moreover, among the memory cells which store the external magnetic field coefficient, ISS is a memory cell which stores a sign. Among the memory cells which store the external magnetic field coefficient, ISV is a memory cell which stores a numerical value.

Each of the memory cells which store the interaction coefficients and the memory cells which store the external magnetic field coefficient includes a multi-valued memory cell. The multi-valued memory cells are memory cells of the flash memory 320. Those other than what are not stored in the flash memory 320 are stored in the memory cells of the SRAM 310.

In the example of FIG. 6, in the memory cells of the flash memory 320, the numerical values of the interaction coefficients (IUV, IDV, and illustration-omitted ILV, IRV and IFV) and the numerical value of the external magnetic field coefficient (illustration-omitted ISV) are stored. In the memory cells of the SRAM 310, the signs of the interaction coefficients (IUS, IDS, and illustration-omitted ILS, IRS and IFS), the sign of the external magnetic field coefficient (illustration-omitted ISS) and the value of the spin (N0) are stored.

In the present embodiment, since multiple values are applied as the interaction coefficients and the external magnetic field coefficient, an example of five values such as +1, +0.5, 0, −0.5 and −1 is assumed, but the present invention is not limited thereto. In the case of the five values of +1, +0.5, 0, −0.5 and −1, the numerical values of the interaction coefficients and the external magnetic field coefficient are 1, 0.5 and 0 and the signs thereof are + and −.

The interaction calculation circuit 330 determines the next state of the spin in its own spin unit 300 based on the interaction coefficients and the external magnetic field coefficient which are stored in the SRAM 310 and the flash memory 320 in its own spin unit 300 and the spin values from the adjacent spin units 300. The value of the next state of the spin (NEW0) is written to the memory cell N0. In other words, in the interaction calculation circuit 330, the next state of the spin is determined by the interaction calculation using the multiple values according to the values of the adjacent spins (NU, ND, illustration-omitted NL, NR and NF), the interaction coefficients corresponding thereto (IUS, IUV, IDS, IDV, illustration-omitted ILS, ILV, IRS, IRV, IFS and IFV), and the external magnetic field coefficient (illustration-omitted ISS and ISV).

Note that the configuration of the spin unit 300 is not limited to that of the example of FIG. 6, and a configuration which stores the numerical values and the signs of the interaction coefficients and the numerical value and the sign of the external magnetic field coefficient in the memory cells of the flash memory 320 and stores the spin values in the memory cells of the SRAM 310 can also be employed (see FIG. 12 described later). Namely, the configuration in which all of the interaction coefficients and the external magnetic field coefficient except for the spin values are stored in the memory cells of the flash memory 320 can also be employed. In the case of this configuration, for example, a read circuit can also be provided in the spin unit 300 although it is different from the configuration of FIG. 12 described later. In such a configuration, in the spin unit 300, the read circuit reads the values of the memory cells of the flash memory 320 and outputs these read values to the interaction calculation circuit 330. Then, the interaction calculation circuit 330 determines the next state of the spin by the interaction calculation using the multiple values.

<9. Circuit Configuration of Interaction Calculating Circuit>

Figure 7:
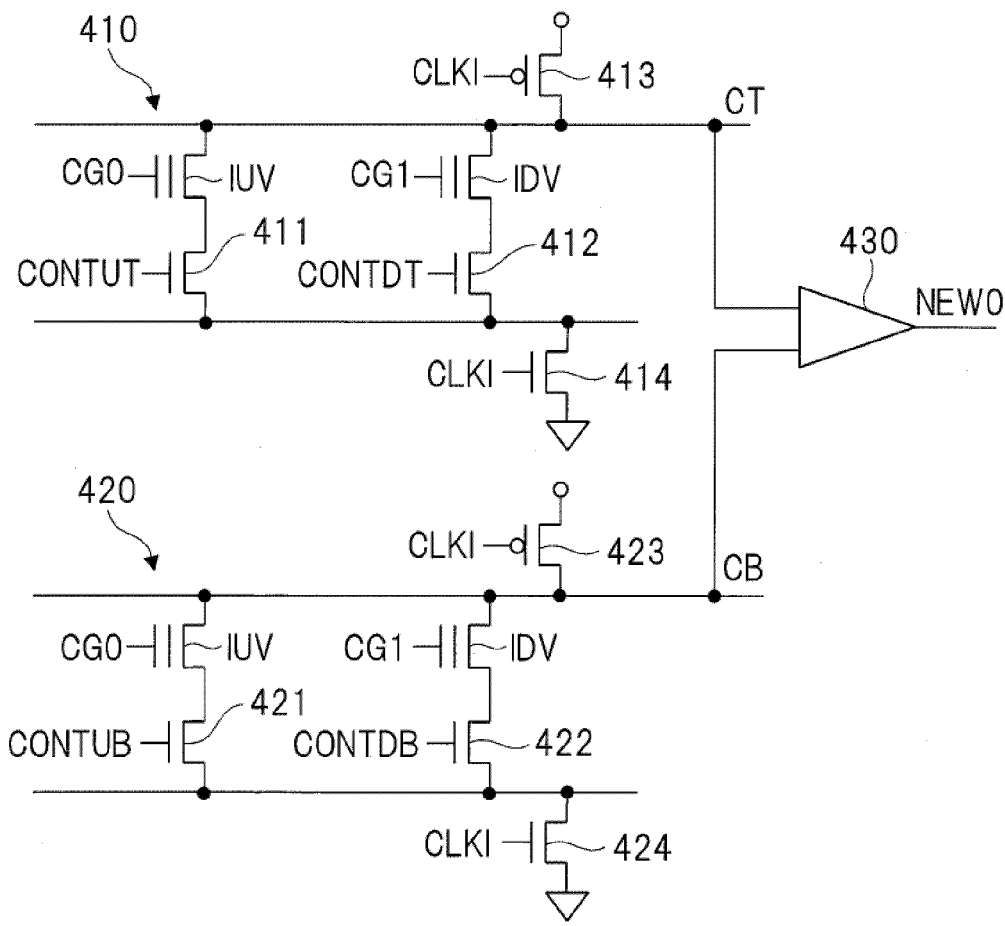
FIG. 7 is a drawing for describing an example of the circuit configuration of an interaction calculating circuit in the spin unit of FIG. 6.

FIG. 7 is a drawing for describing an example of the circuit configuration of the interaction calculating circuit in the spin unit 300 shown in FIG. 6. The interaction calculating circuit refers to the part including the memory cells of the SRAM 310, the memory cells of the flash memory 320, and the interaction calculation circuit 330.

FIG. 7 shows a circuit configuration in which the interaction calculating circuit is separated into a plus-side calculating circuit 410 which calculates the interactions of plus-side spins and a minus-side calculating circuit 420 which calculates the interactions of minus-side spins, and the voltage of a common line CT of the plus-side calculating circuit and the voltage of a common line CB of the minus-side calculating circuit are compared with each other by a voltage comparison circuit 430 to determine the value NEW0 of the next state of the spin.

The plus-side calculating circuit 410 is formed by parallelly connecting a memory cell IUV (numerical value of the interaction coefficient in the flash memory) and a NMOS transistor 411, which are connected in series, and a memory cell IDV (numerical value of the interaction coefficient in the flash memory) and a NMOS transistor 412, which are connected in series. The gate of the memory cell IUV is controlled by a control signal CG0, and the gate of the NMOS transistor 411 is controlled by a control signal CONTUT. The gate of the memory cell IDV is controlled by a control signal CG1, and the gate of the NMOS transistor 412 is controlled by a control signal CONTDT.

In this parallel connection, the memory cells IUV and IDV are connected to the common line CT. The common line CT is connected to a power-supply potential via a PMOS transistor 413. A voltage for comparison with the minus-side calculating circuit 420 appears in the common line CT. On the other hand, in the parallel connection, the NMOS transistor 411 and the NMOS transistor 412 are connected to a ground potential via a NMOS transistor 414. The gates of the PMOS transistor 413 and the NMOS transistor 414 are controlled by a clock signal CLKI.

Similarly, the minus-side calculating circuit 420 is also formed by parallelly connecting a memory cell IUV and a NMOS transistor 421, which are connected in series, and a memory cell IDV and a NMOS transistor 422, which are connected in series. The gate of the memory cell IUV is controlled by a control signal CG0, and the gate of the NMOS transistor 421 is controlled by a control signal CONTUB. The gate of the memory cell IDV is controlled by a control signal CG1, and the gate of the NMOS transistor 422 is controlled by a control signal CONTDB.

In this parallel connection, the memory cells IUV and IDV are connected to the common line CB. The common line CB is connected to a power-supply potential via a PMOS transistor 423. A voltage for comparison with the plus-side calculating circuit 410 appears in the common line CB. On the other hand, in the parallel connection, the NMOS transistor 421 and the NMOS transistor 422 are connected to a ground potential via a NMOS transistor 424. The gates of the PMOS transistor 423 and the NMOS transistor 424 are controlled by a clock signal CLKI.

Figure 10:
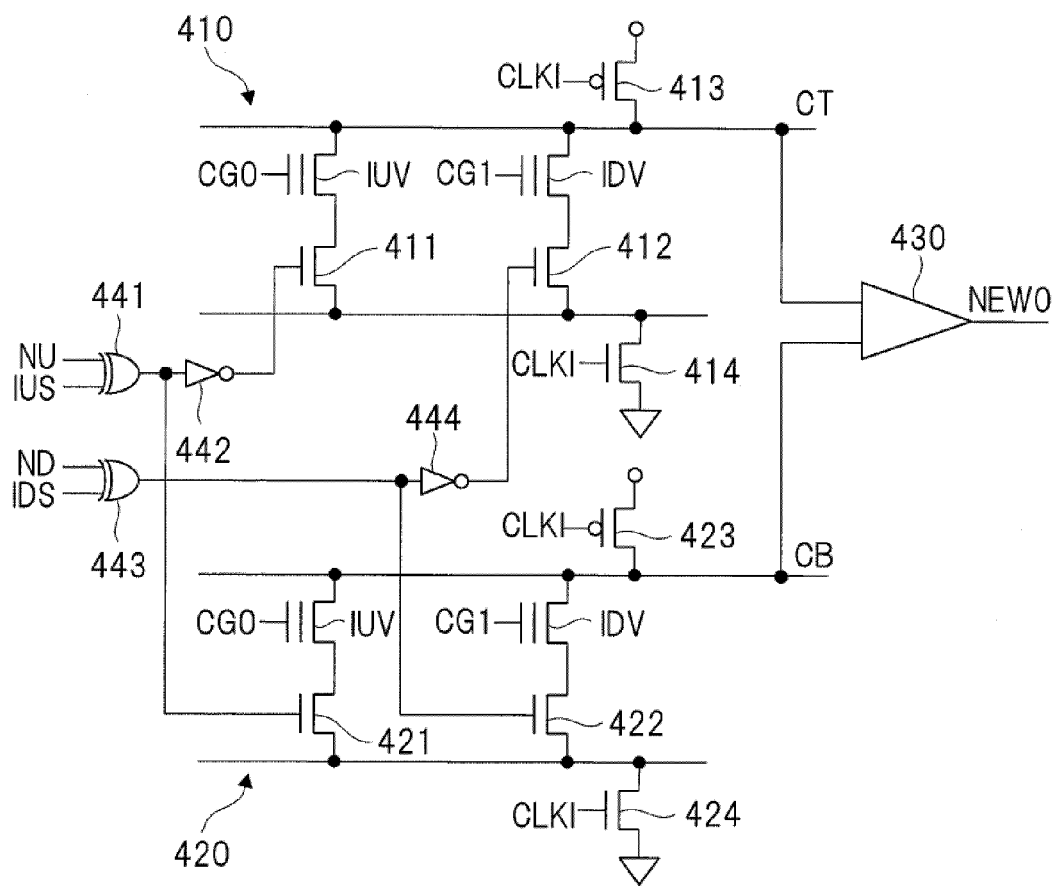
FIG. 10 is a drawing for describing an example of the circuit configuration of the interaction calculating circuit (including generation circuits of control signals) in the spin unit of FIG. 6.

The operation of the plus-side calculating circuit 410 and the minus-side calculating circuit 420 formed in the above-described manner will be described later with reference to FIG. 10 and FIG. 11. FIG. 10 shows generation circuits of the control signals CONTUT, CONTUB, CONTDT and CONTDB shown in FIG. 7 together.

<10. Flash Memory>

Figure 8:
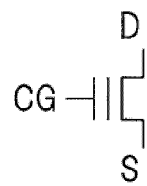
FIG. 8 is a drawing for describing an example of a flash memory (symbol of the flash memory) in the spin unit of FIG. 6.
Figure 9:
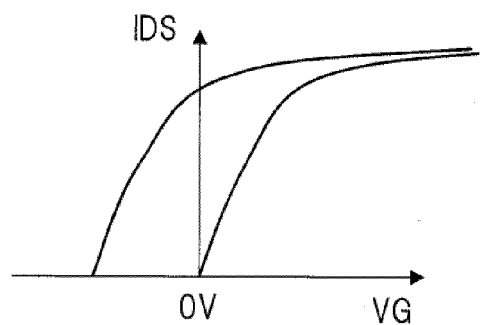
FIG. 9 is a drawing for describing an example of the flash memory (characteristics of the flash memory) in the spin unit of FIG. 6.

FIG. 8 and FIG. 9 are drawings for describing an example of the flash memory 320. FIG. 8 shows a symbol of the flash memory, and FIG. 9 shows characteristics of the flash memory.

As shown in FIG. 8, the flash memory is represented by a symbol having terminals of a control gate CG, a drain D and a source S. The flash memory has a double-gate structure in which a floating gate is sandwiched between the gate of a MOS transistor and an oxide film. The floating gate is covered with the oxide film and thus normally in an insulated state. However, when a voltage is applied to the control gate, a tunneling current flows through the oxide film, and charge is accumulated in the floating gate. This corresponds to a writing operation. Reversely, when a voltage is applied to the silicon substrate side, the charge accumulated in the floating gate is released. This corresponds to an erasing operation.

If the charge is not accumulated in the floating gate, the resistance between the drain and the source is low, and thus a current flows between the drain and the source only by applying a low voltage to the control gate. Moreover, if the charge is accumulated in the floating gate, the resistance between the drain and the source is high, and thus a current does not flow unless otherwise the voltage of the control gate is increased by some degree. This voltage is referred to as a threshold voltage. Namely, a bit signal of 0 or 1 can be read depending on whether the threshold voltage is low or high. This corresponds to a reading operation of the flash memory.

In the characteristics of the flash memory, the relation of a drain-source current IDS with respect to a gate voltage VG is as shown in FIG. 9. As is understood from the characteristics, a multi-valued memory cell can be realized by causing the level of the threshold voltage corresponding to the gate voltage VG to be multilevel including low, high, and voltage values therebetween. While a memory cell having 1 bit per 1 cell is referred to as a binary memory cell, a memory cell which stores data of three or more levels is referred to as a multi-valued memory cell.

In the example of FIG. 9, in the characteristics on the right side, the drain-source current IDS does not flow at the gate voltage VG=0 V, and thus a level corresponding to 0 can be stored. On the other hand, in the characteristics on the left side, the drain-source current IDS flows even at the gate voltage VG=0 V, and thus a level corresponding to 1 can be stored. Furthermore, in the characteristics between the right-side characteristics and the left-side characteristics, a level corresponding to 0.5 between 0 and 1 can be stored.

In the present embodiment, the flash memory 320 having such multi-valued memory cells is used. The interaction coefficients and the external magnetic field coefficient are stored in the multi-valued memory cells of the flash memory 320 and the memory cells of the SRAM 310 to realize interaction calculations corresponding to, for example, the five values of +1, +0.5, 0, −0.5 and −1.

<11. Circuit Configuration and Circuit Operation of Interaction Calculating Circuit>

Figure 11:
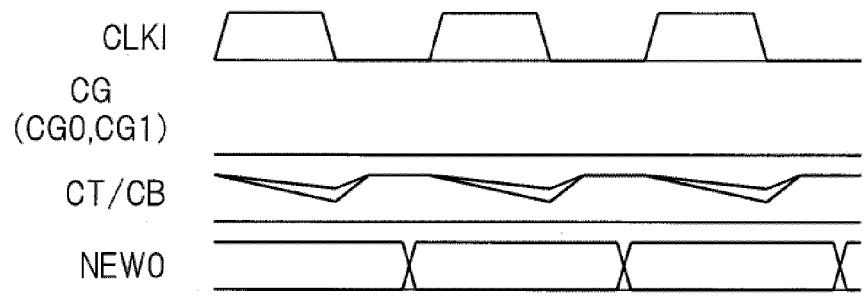
FIG. 11 is a drawing for describing an example of circuit operations of the interaction calculating circuit in the spin unit of FIG. 6.

FIG. 10 and FIG. 11 are drawings for describing an example of the circuit configuration and the circuit operation of the interaction calculating circuit. FIG. 10 shows an example of the circuit configuration of the interaction calculating circuit including the generation circuits of the control signals according to the interaction calculating circuit shown in FIG. 7. FIG. 11 shows an example of voltage waveforms of the respective parts in the circuit operation of the interaction calculating circuit shown in FIG. 10. Here, the descriptions about the parts redundant with the interaction calculating circuit (plus-side calculating circuit 410 and minus-side calculating circuit 420) shown in FIG. 7 are omitted.

As shown in FIG. 10, the control signal CONTUT which controls the gate of the NMOS transistor 411 and the control signal CONTUB which controls the gate of the NMOS transistor 421 are generated by using an exclusive-OR circuit 441 and an inverter 442. The exclusive-OR circuit 441 receives the value of the adjacent spin (NU) and the sign of the interaction coefficient (IUS) as inputs and outputs the control signal CONTUB by exclusive OR. The gate of the NMOS transistor 421 is controlled by the control signal CONTUB. The inverter 442 receives the control signal CONTUB of the output of the exclusive-OR circuit 441 as an input and inverts it to output the control signal CONTUT. The gate of the NMOS transistor 411 is controlled by the control signal CONTUT.

Similarly, the control signal CONTDT which controls the gate of the NMOS transistor 412 and the control signal CONTDB which controls the gate of the NMOS transistor 422 are generated by using an exclusive-OR circuit 443 and an inverter 444. The exclusive-OR circuit 443 receives the value of the adjacent spin (ND) and the sign of the interaction coefficient (IDS) as inputs and outputs the control signal CONTDB by exclusive OR. The gate of the NMOS transistor 422 is controlled by the control signal CONTDB. The inverter 444 receives the control signal CONTDB of the output of the exclusive-OR circuit 443 as an input and inverts it to output the control signal CONTDT. The gate of the NMOS transistor 412 is controlled by the control signal CONTDT.

The interaction calculating circuit including the generation circuits of the control signals like these is operated as follows. The interaction calculating circuit is operated in synchronization with the clock signal CLKI shown in FIG. 11. Here, for simplicity, a block corresponding to the interaction coefficient IUx is focused on, and the part that carries out the calculation using the data input from NU and the interaction coefficients retained in IUS and IUV will be described.

The common line CT to which the memory cell IUV of the flash memory 320 and the NMOS transistor 411 are connected and the common line CB to which the memory cell IUV of the flash memory 320 and the NMOS transistor 421 are connected are pre-charged to a high potential before an interaction calculation is carried out, in other words, in a period in which the voltage level of the clock signal CLKI shown in FIG. 11 is low. When the clock signal CLKI becomes high, the NMOS transistors 414 and 424 to which the clock signal CLKI is input are turned on, and the calculation of the value of the interaction is started. At this point of time, the control signal CG (CG0) of the memory cell IUV of the flash memory is low, and the memory cell IUV is in an on state.

If the values of NU and IUS are equal, the NMOS transistor 411 is turned on and a current flows through the path in which the memory cell IUV of the flash memory 320 and the NMOS transistor 411 are connected in series, so that the potential of the common line CT is reduced. Reversely, if the values of NU and IUS are different from each other, the NMOS transistor 421 is turned on and a current flows through the path in which the memory cell IUV of the flash memory 320 and the NMOS transistor 421 are connected in series, so that the potential of the common line CB is reduced. The potential reduction of the common line CT or the common line CB in this case becomes the voltage depending on the drain-source current corresponding to, for example, the values of +1, +0.5, −0.5 and −1 of the memory cell IUV of the flash memory 320 serving as a multi-valued memory cell.

This is similar also in the blocks corresponding to the other interaction coefficients IDx. Calculations using the data input from ND and the interaction coefficients retained in IDS and IDV are carried out.

More specifically, regarding the coefficient for which the values of the input data and the interaction coefficient are equal, the current which reduces the potential of the common line CT to which the plurality of current paths connected in parallel are connected flows, and regarding the coefficient for which the values of the input data and the interaction coefficient are different, the current which reduces the potential of the common line CB to which the plurality of current paths connected in parallel are connected flows. In other words, regarding the coefficient for which the value of exclusive OR in the interaction calculation is 1, the current which reduces the potential of the common line CT flows, and regarding the coefficient for which the value is 0, the current which reduces the potential of the common line CB flows.

Then, the voltage of the common line CT and the voltage of the common line CB are compared by the voltage comparison circuit 430. The voltage comparison circuit 430 judges which one of the plus side according to the voltage of the common line CT and the minus side according to the voltage of the common line CB has a larger action, and outputs the one having a larger action as the value NEW0 of the next state of the spin. For example, if the voltage of the common line CT is high, 0 is output as the value NEW0 of the next state of the spin, and if the voltage of the common line CB is high, 1 is output as the value NEW0 of the next state of the spin.

The above-described operations are repeatedly executed every time the voltage level of the clock signal CLKI becomes high or low. At each of the repetitions of the operations, the voltages which respectively appear in the common line CT and the common line CB are compared, and the plus side or the minus side that has the larger action can be determined as the next state of the spin.

Note that, if the interaction calculating circuit has the configuration in which both of the numerical values and the signs of the interaction coefficients and the external magnetic field coefficient are stored in the memory cells of the flash memory 320, the circuit configuration is as follows though not illustrated. For example, in the configuration of the block corresponding to the interaction coefficient IUx, the memory cell IUV, the memory cell IUS and the NMOS transistor (NU) are connected in series to each of the common line CT and the common line CB. The same is true for the block corresponding to the interaction coefficient IDx. Also in such a configuration of the interaction calculating circuit, operations are similar to those described above.

<12. Read Circuit of Flash Memory>

Figure 12:
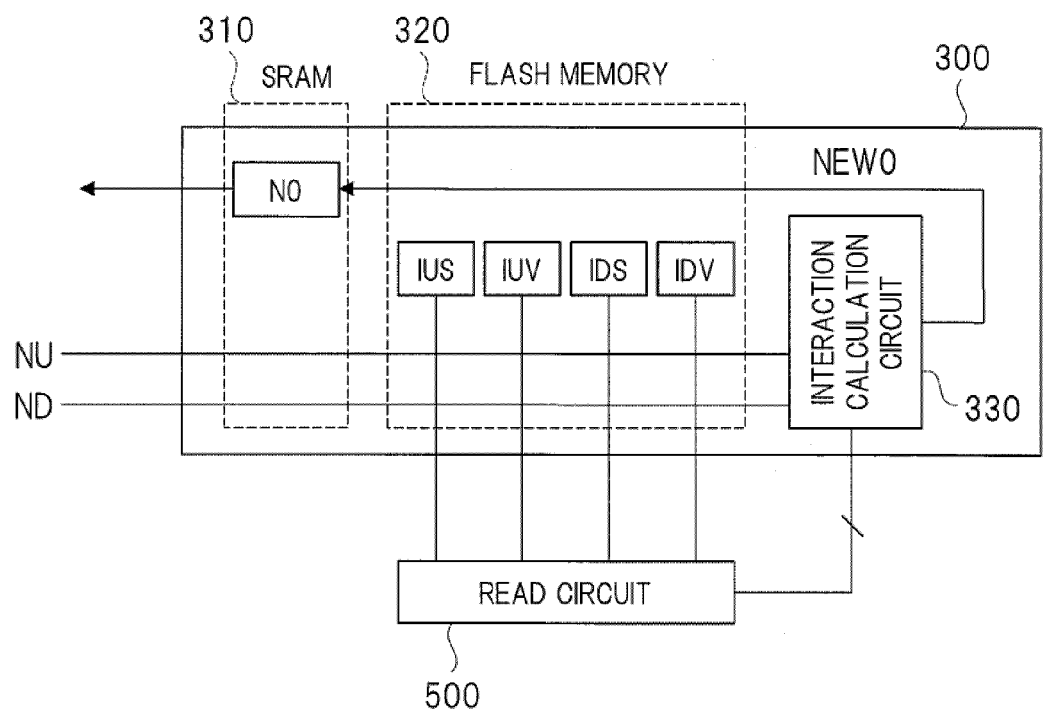
FIG. 12 is a drawing for describing an example of the configuration of a read circuit of the flash memory in the spin array of the Ising chip of FIG. 1.
Figure 13:
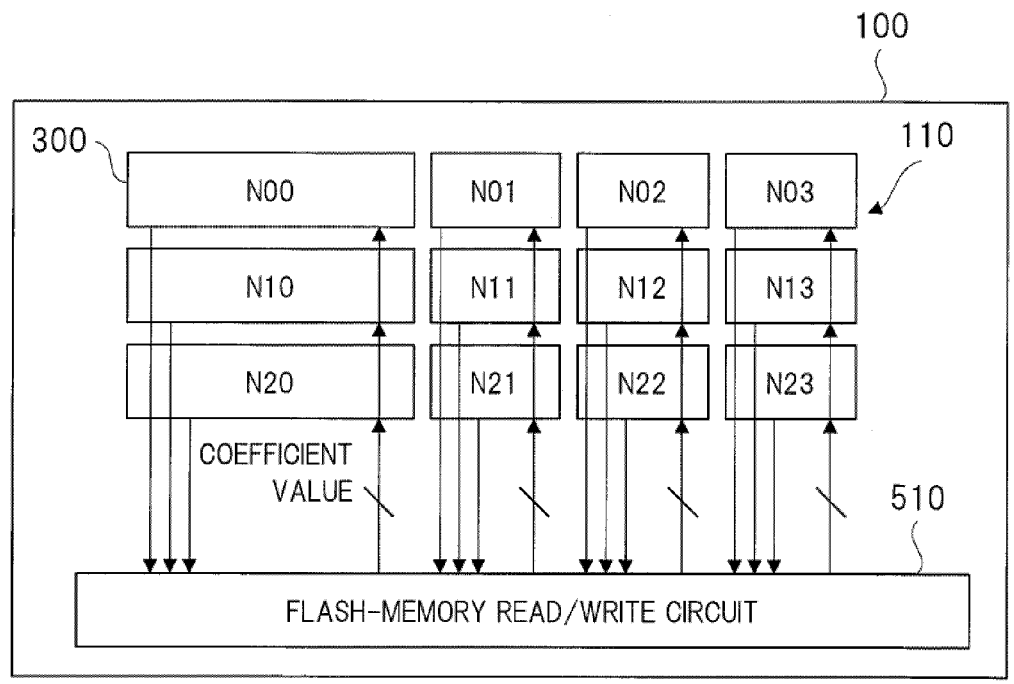
FIG. 13 is a drawing for describing an example of the overall configuration of the spin array in the case in which the spin unit has the configuration of FIG. 12.

FIG. 12 and FIG. 13 are drawings for describing an example of the configuration of the read circuit of the flash memory 320. FIG. 12 shows an example of the configuration in which the read circuit of the flash memory 320 is provided outside the spin unit 300. FIG. 13 shows an example of the overall configuration of the spin array 110 in the case in which the spin unit 300 has the configuration of FIG. 12.

FIG. 12 shows the configuration in which the numerical values (IUV, IDV, illustration-omitted ILV, IRV and IFV) and the signs (IUS, IDS, illustration-omitted ILS, IRS and IFS) of the interaction coefficients and the numerical value (illustration omitted) and the sign (illustration omitted) of the external magnetic field coefficient are stored in the memory cells of the flash memory 320 and the value of the spin (NO) is stored in the memory cell of the SRAM 310. More specifically, in this configuration, all of the interaction coefficients and the external magnetic field coefficient except for the value of the spin which is frequently rewritten and has to be output to other spin units are stored in the memory cells of the flash memory 320 which can be reduced in circuit scale.

In the configuration of FIG. 12, the memory cell N0 of the SRAM 310, the memory cells IUS, IUV, IDS and IDV of the flash memory 320, and the interaction calculation circuit 330 which determines the next state (NEW0) of the spin by the interaction calculation using the multiple values according to the values of the adjacent spins (NU, ND), the interaction coefficients and the external magnetic field coefficient are provided in the spin unit 300. Outside the spin unit 300, a read circuit 500 which reads the values of the memory cells IUS, IUV, IDS and IDV of the flash memory 320 in the spin unit 300 and outputs the values to the interaction calculation circuit 330 in the spin unit 300 is provided. The output from the read circuit 500 outside the spin unit 300 to the interaction calculation circuit 330 in the spin unit 300 has a bit width corresponding to the number of the memory cells of the flash memory 320.

In the case of the configuration in which the read circuit 500 of the flash memory 320 is provided outside the spin unit 300 like the spin unit 300 shown in FIG. 12, the read circuit 500 outside the spin unit 300 reads the values of the memory cells of the flash memory 320 in the spin unit 300 and outputs the read values to the interaction calculation circuit 330 in the spin unit 300. Then, the interaction calculation circuit 330 determines the next state of the spin (NEW0) by the interaction calculation using the multiple values according to the values of the spins (NU, ND) from the adjacent spin units and the interaction coefficients (IUS, IUV, IDS, IDV) and the external magnetic field coefficient from the read circuit 500, and writes the determined value to the memory cell N0 of the SRAM 310.

The spin array 110 having the configuration of the spin unit 300 shown in FIG. 12 has the configuration as shown in FIG. 13. More specifically, FIG. 13 shows an example in which the plurality of spin units 300 are disposed in a two-dimensional lattice pattern so that the four units are disposed in a row direction and the three units are disposed in a column direction. In order to distinguish the spin units 300, for the sake of convenience of descriptions, coordinates (the row direction is N00, N01, N02 and N03 and the column direction is N00, N10 and N20) are given thereto. This Ising chip 100 includes the plurality of spin units 300 disposed in the two-dimensional lattice pattern and a flash-memory read/write circuit 510 which is shared by the plurality of spin units 300 and has a flash memory compatible interface.

The flash-memory read/write circuit 510 has the flash-memory compatible interface similar to that used for the read/write from/to a general flash memory and is provided with a function of reading the values of the flash memory 320 and a function of writing values to the flash memory 320. The flash-memory read/write circuit 510 is desired to be shared by the plurality of spin units 300 because the circuit scale thereof is large.

In the case of the configuration of the spin array 110 shown in FIG. 13, the flash-memory read/write circuit 510 outside the spin units 300 reads the values of the memory cells of the flash memory 320 in each of the spin units 300 and outputs the read values as coefficient values to the interaction calculation circuit 330 in each of the spin units 300 by a bit width corresponding to the number of the memory cells.

For example, in FIG. 13, the spin units N00, N10 and N20 in the column direction are operated in the order as follows. First, the flash-memory read/write circuit 510 reads the values of the flash memory 320 in the spin unit N00 and outputs the read coefficient values to the interaction calculation circuit 330 in the spin unit N00 by the bit width corresponding to the number of the memory cells. Then, the interaction calculation circuit 330 of the spin unit N00 determines the next state (NEW0) of the spin (N0) by the interaction calculation using the multiple values based on the values of the spins from the adjacent spin units and the interaction coefficients and the external magnetic field coefficient from the flash-memory read/write circuit 510, and writes the determined value to the memory cell N0 of the SRAM 310.

Subsequently, also for the spin unit N10, the flash-memory read/write circuit 510 similarly reads the values of the flash memory 320 in the spin unit N10 and outputs the read coefficient values to the interaction calculation circuit 330 in the spin unit N10 by the bit width corresponding to the number of the memory cells. Then, the interaction calculation circuit 330 of the spin unit N10 determines the next state of the spin by the interaction calculation using the multiple values based on the values of the spins from the adjacent spin units and the interaction coefficients and the external magnetic field coefficient from the flash-memory read/write circuit 510, and writes the determined value to the memory cell N0 of the SRAM 310. The same is true for the spin unit N20 operated subsequently.

The same is true for the other cases of the spin units N01, N11 and N21, the spin units N02, N12 and N22 and the spin units N03, N13 and N23 in the column direction. As described above, the flash-memory read/write circuit 510 processes the plurality of spin units 300 arranged in the two-dimensional lattice pattern one by one and executes the interaction calculations for determining the next state (NEW0) of the spin (N0) of each of the spin units 300.

Moreover, the flash-memory read/write circuit 510 is provided with a function of writing values to the flash memory 320. In the writing to the flash memory 320, the charge corresponding to the voltage of the common line to which the drain is connected is accumulated in the floating gate by applying a voltage to the control gate of the memory cell. For example, if the common line has a high potential, a high value can be written to the memory cell, and if the common line has a low potential, a low value can be written to the memory cell.

<13. Read Circuit of Flash Memory and Interaction Calculation Circuit>

Figure 14:
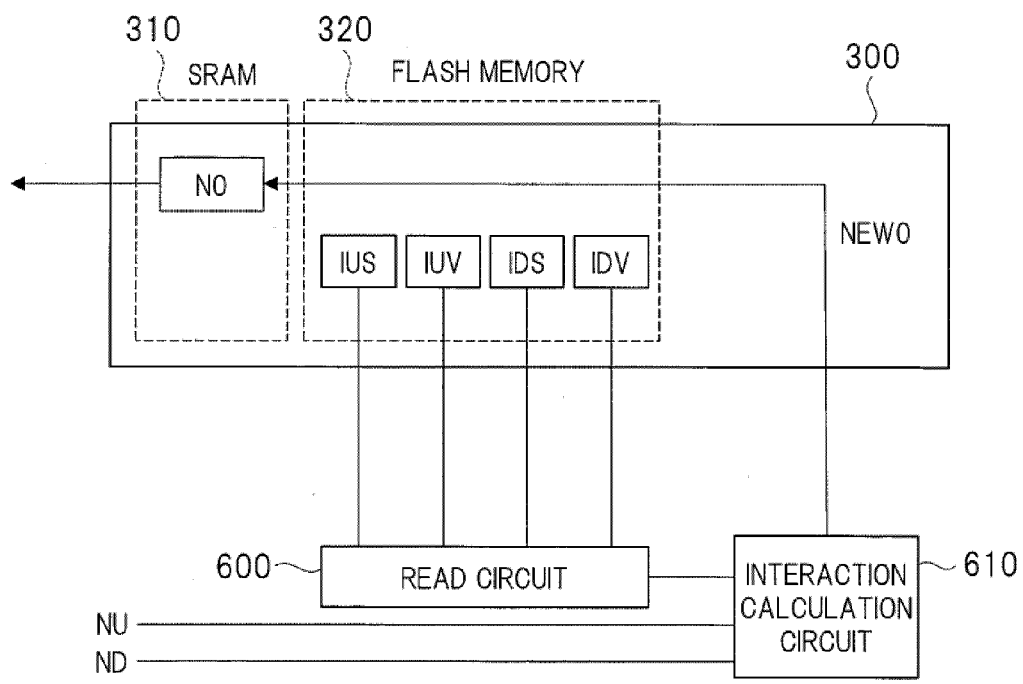
FIG. 14 is a drawing for describing an example of the configuration of a read circuit of the flash memory and an interaction calculation circuit in the spin array of the Ising chip of FIG. 1.
Figure 15:
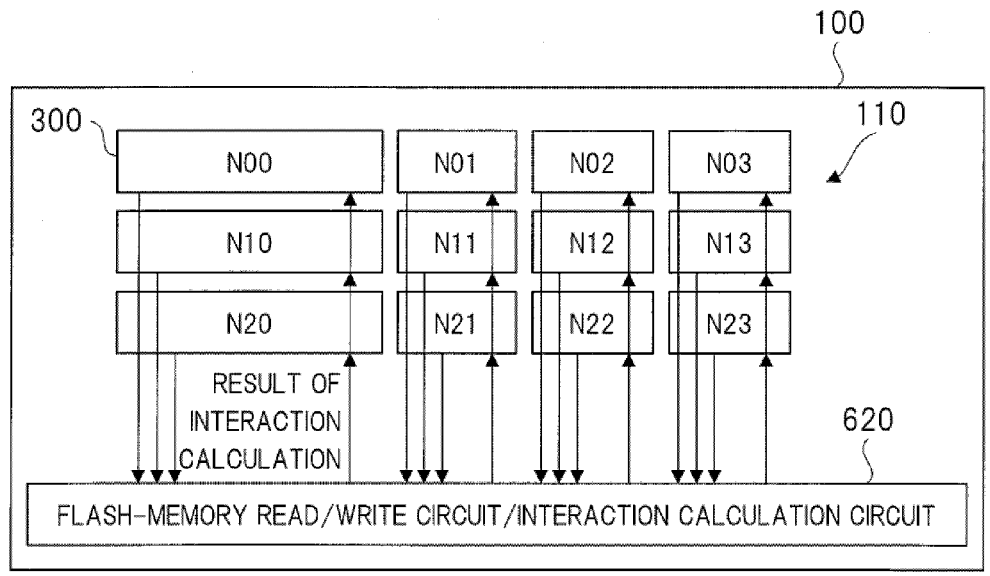
FIG. 15 is a drawing for describing an example of the overall configuration of the spin array in the case in which the spin unit has the configuration of FIG. 14.

FIG. 14 and FIG. 15 are drawings for describing an example of the configuration of a read circuit of the flash memory 320 and an interaction calculation circuit. FIG. 14 shows an example of the configuration in which the read circuit of the flash memory 320 and the interaction calculation circuit are provided outside the spin unit 300. FIG. 15 shows an example of the overall configuration of the spin array 110 in the case in which the spin unit 300 has the configuration of FIG. 14. More specifically, FIG. 14 and FIG. 15 show the configuration in which the interaction calculation circuit is further provided outside the spin unit 300 relative to the configuration of FIG. 12 and FIG. 13 described above.

In the configuration of FIG. 14, the memory cell N0 of the SRAM 310 and the memory cells IUS, IUV, IDS and IDV of the flash memory 320 are provided in the spin unit 300. The read circuit 600 which reads the values of the memory cells IUS, IUV, IDS and IDV of the flash memory 320 in the spin unit 300 is provided outside the spin unit 300. Furthermore, the interaction calculation circuit 610 which determines the next state (NEW0) of the spin by the interaction calculation using the multiple values according to the values of the adjacent spins (NU, ND) and the interaction coefficients and the external magnetic field coefficient from the read circuit 600 is provided outside the spin unit 300. The output from the interaction calculation circuit 610 outside the spin unit 300 to the memory cell N0 of the SRAM 310 in the spin unit 300 is a 1-bit output.

In the case of the configuration in which the read circuit 600 of the flash memory 320 and the interaction calculation circuit 610 are provided outside the spin unit 300 like the spin unit 300 shown in FIG. 14, the read circuit 600 outside the spin unit 300 reads the values of the memory cells of the flash memory 320 in the spin unit 300 and outputs the read values to the interaction calculation circuit 610. Then, the interaction calculation circuit 610 determines the next state (NEW0) of the spin by the interaction calculation using the multiple values according to the values of the spins (NU, ND) from the adjacent spin units and the interaction coefficients (IUS, IUV, IDS, IDV) and the external magnetic field coefficient from the read circuit 600, and writes the determined value (NEW0) to the memory cell NO of the SRAM 310 in the spin unit 300.

The spin array 110 in the case of the configuration of the spin unit 300 shown in FIG. 14 has the configuration as shown in FIG. 15. FIG. 15 also shows the example in which the plurality of spin units 300 are arranged in a two-dimensional lattice pattern so that the four units are disposed in the row direction and the three units are disposed in the column direction, and coordinates (the row direction is N00, N01, N02 and N03 and the column direction is N00, N10 and N20) are given thereto. This Ising chip 100 has the plurality of spin units 300 arranged in the two-dimensional lattice pattern and a flash-memory read/write circuit/interaction calculation circuit 620 which is shared by the plurality of spin units 300 and has a flash memory compatible interface.

In the case of the configuration of the spin array 110 shown in FIG. 15, the flash-memory read/write circuit/interaction calculation circuit 620 outside the spin units 300 reads the values of the memory cells of the flash memory 320 in each of the spin units 300, carries out the interaction calculation using the multiple values based on the read values and the values from the adjacent spin units, determines the result of the interaction calculation as the next state of the spin (N0), and writes the determined value (NEW0) to the memory cell NO of the SRAM 310 in each of the spin units 300.

For example, in FIG. 15, the spin units N00, N10 and N20 in the column direction are operated in the order as follows. First, the flash-memory read/write circuit/interaction calculation circuit 620 reads the values of the flash memory 320 in the spin unit N00, carries out the interaction calculation using the multiple values based on the read values and the values from the adjacent spin units, and writes the result of the interaction calculation to the memory cell N0 of the SRAM 310 in the spin unit N00.

Subsequently, also for the spin unit N10, the flash-memory read/write circuit/interaction calculation circuit 620 similarly reads the values of the flash memory 320 in the spin unit N10, carries out the interaction calculation using the multiple values based on the read values and the values from the adjacent spin units, and writes the result of the interaction calculation to the memory cell N0 of the SRAM 310 in the spin unit N10. The same is true for the spin unit N20 operated subsequently.

The same is true for the other cases of the spin units N01, N11 and N21, the spin units N02, N12 and N22 and the spin units N03, N13 and N23 in the column direction. As described above, the flash-memory read/write circuit/interaction calculation circuit 620 processes the plurality of spin units 300 arranged in the two-dimensional lattice pattern one by one, determines the next state of the spin (N0) of each of the spin units 300, and executes an interaction calculation of writing the determined value (NEW0) to the memory cell N0 of the SRAM 310 of each of the spin units 300.

<14. Procedure of Interaction Operation of Ising Chip>

Figure 16:
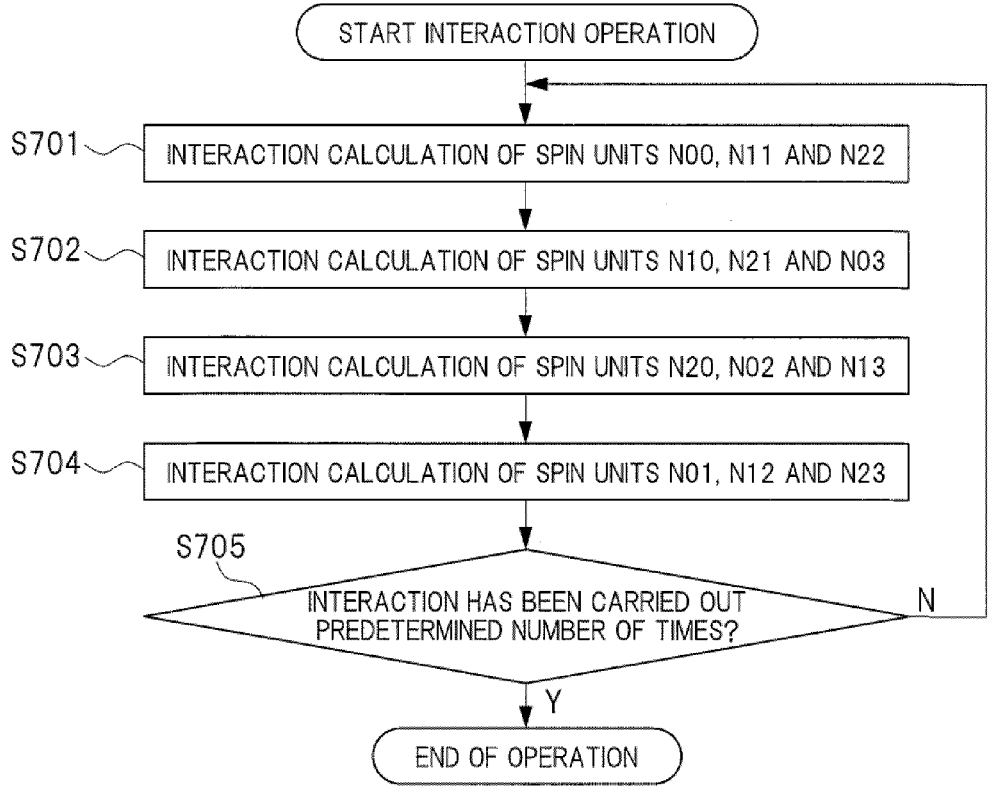
FIG. 16 is a flow chart for describing an example of the procedure of the interaction operations of the Ising chip of FIG. 1.

FIG. 16 is a flow chart for describing an example of the procedure of the interaction operations of the Ising chip 100. FIG. 16 shows an example of interaction operations in the configuration of the spin array 110 shown in FIG. 13 and FIG. 15 described above.

The procedure of the interaction operations of the Ising chip 100 shows a procedure of the interaction operations in which the Ising chip 100 is controlled by the CPU 210 for the ground state search in the information processing device 200 incorporating the Ising chip 100.

Before the interaction operations are started, as initial setting, the values of spins, the interaction coefficients and the external magnetic field coefficient are input to the memory cells of the SRAM 310 and the flash memory 320 in each of the spin units 300 of the Ising chip 100. In the present embodiment, the interaction coefficients and the external magnetic field coefficient are, for example, the values of +1, +0.5, 0, −0.5 and −1 in order to support multiple values. However, they are not limited to these values.

After the initial setting is completed, the interaction operations are started. When the interaction operations are started, interaction calculations of the spin units 300 are executed in steps S701 to S704. In the interaction calculations, addresses are input to the Ising chip 100 via the interaction address line 180, a clock signal is generated via the interaction clock line 181, and interactions are caused to occur in the Ising chip 100. Moreover, the voltage supplied to the spin power line 141 is controlled in accordance with scheduling.

In this case, if trying to update all of the spins at the same time, since a spin is updated in view of the adjacent spins so as to minimize the energy between the spin and the adjacent spins, when the spin and the adjacent spins are updated at the same time, the updating of both of them are overlapped with each other, with the result that the energy cannot be minimized and oscillations occur. For this reason, in the present embodiment, the pin units 300 in the spin array 110 are grouped so that the adjacent spins are not updated at the same time.

For example, in the configuration of the spin array 110 shown in FIG. 13 and FIG. 15 described above, first, in step S701, the interaction calculations of the spin units N00, N11 and N22 are carried out. In this step S701, in the arrangement of the spin units 300 of FIG. 13 and FIG. 15, the interaction calculations are carried out by sequentially selecting the spin unit N00 in the upper left and the spin units N11 and N22 in the right downward direction. The values of the memory cells of the adjacent spin units are updated by the values of the calculation results of the spin units N00, N11 and N22.

For example, by the value of the calculation result of the spin unit N00, the values of the memory cells of the right-side spin unit N01 and the lower-side spin unit N10 are updated. Similarly, by the value of the calculation result of the spin unit N11, the values of the memory cells of the upper-side spin unit N01, the left-side spin unit N10, the right-side spin unit N12 and the lower-side spin unit N21 are updated. By the value of the calculation result of the spin unit N22, the values of the memory cells of the upper-side spin unit N12, the left-side spin unit N21 and the right-side spin unit N23 are updated.

Similarly, the interaction calculations of the spin units N10, N21 and N03 (step S702), the interaction calculations of the spin units N20, N02 and N13 (step S703) and the interaction calculations of the spin units N01, N12 and N23 (step S704) are sequentially executed.

The interaction calculations of all of the spin units in steps S701 to S704 are repeated a predetermined number of times (step S705), and after the predetermined number of times is completed, the interaction operations are terminated. When the interaction operations are terminated, the solution of the Ising model expressing a target problem can be obtained by reading the value of the spin corresponding to the result of the interaction calculation from the Ising chip 100.

<15. Effects>

According to the present embodiment described above, since the memory cells which store the interaction coefficients and the memory cells which stores the external magnetic field coefficient in the spin unit 300 include the multi-valued memory cells, it is possible to provide the technique that enables the interaction calculations using coefficients of multiple values of three or more values in the Ising chip 100 which obtains the ground state of the Ising model. Further details thereof are as follows.

(1) The multi-valued memory cells are the memory cells of the flash memory 320. Thus, the memory cells of the flash memory 320 can store the numerical values of the interaction coefficients and the numerical value of the external magnetic field coefficient as multiple values such as five values. In this case, the memory cells of the SRAM 310 can store the signs of the interaction coefficients, the sign of the external magnetic field coefficient and the value of the spin.

(2) The multi-valued memory cells are the memory cells of the flash memory 320. Thus, the memory cells of the flash memory 320 can store the numerical values and the signs of the interaction coefficients and the numerical value and the sign of the external magnetic field coefficient as multiple values such as five values. In this case, the memory cells of the SRAM 310 can store the value of the spin.

(3) The interaction calculation circuit 330 is disposed inside or outside the spin unit 300. Thus, the interaction calculation circuit 330 can determine the next state of the spin by the interaction calculation using the multiple values according to the products of the values of the adjacent spins and the interaction coefficients corresponding thereto and the external magnetic field coefficient.

(4) The spin unit 300 includes the read circuit and the interaction calculation circuit 330. Thus, the read circuit can read the interaction coefficients and the external magnetic field coefficient stored in the memory cells of the flash memory 320. Then, the interaction calculation circuit 330 can determine the next state of the spin by the interaction calculation using the multiple values according to the products of the values of the adjacent spins and the interaction coefficients from the read circuit and the external magnetic field coefficient from the read circuit.

(5) The spin unit 300 includes the interaction calculation circuit 330, and the read circuit 500 is disposed outside the spin unit 300. Thus, the read circuit 500 can read the interaction coefficients and the external magnetic field coefficient stored in the memory cells of the flash memory 320 in the spin unit 300 and output the read interaction coefficients and external magnetic field coefficient to the interaction calculation circuit 330 in the spin unit 300. Then, the interaction calculation circuit 330 can determine the next state of the spin by the interaction calculation using the multiple values according to the products of the values of the adjacent spins and the interaction coefficients from the read circuit 500 and the external magnetic field coefficient from the read circuit 500. Moreover, the read circuit 500 can be shared by the plurality of spin units 300.

(6) The read circuit 600 and the interaction calculation circuit 610 are disposed outside the spin unit 300. Thus, the read circuit 600 can read the interaction coefficients and the external magnetic field coefficient stored in the memory cells of the flash memory 320 in the spin unit 300. Then, the interaction calculation circuit 610 can determine the next state of the spin by the interaction calculation using the multiple values according to the products of the values of the adjacent spins and the interaction coefficients from the read circuit 600 and the external magnetic field coefficient from the read circuit 600. Moreover, the read circuit 600 and the interaction calculation circuit 610 can be shared by the plurality of spin units 300.

(7) The interaction calculation circuit 330 has a logic circuit including the plus-side calculating circuit 410 and the minus-side calculating circuit 420 and the voltage comparison circuit 430 which compares the magnitude of the actions of the plus-side calculating circuit 410 and the minus-side calculating circuit 420. Thus, the plus-side calculating circuit 410 can calculate the magnitude of the plus-side action in the configuration made up of the plurality of current paths connected in parallel. Also, the minus-side calculating circuit 420 can calculate the magnitude of the minus-side action in the configuration made up of the plurality of current paths connected in parallel. Then, the voltage comparison circuit 430 can compare the voltage of the common line CT on which the result of the plus-side calculating circuit 410 appears with the voltage of the common line CB on which the result of the minus-side calculating circuit 420 appears and output the value corresponding to the higher voltage as the value that determines the next state of the spin.

(8) In the information processing device 200, for the spin unit 300 in the spin array 110, a control program of the Ising chip 100 writes the value of the spin to the memory cell, writes the interaction coefficients to the multi-valued memory cells, and writes the external magnetic field coefficient to the multi-valued memory cell. Then, by repeatedly executing the ground state searching process of the spin unit 300 a predetermined number of times, the value of the spin of the spin unit 300 which has reached the ground state can be read, and the solution of a target problem can be obtained.

(9) In the ground state searching process of the spin unit 300, it is possible to prevent the adjacent spin units 300 from being updated at the same time by grouping the spin units and repeatedly executing the process the predetermined times for each group.

(10) In the Ising chip 100, the interaction coefficients and the external magnetic field coefficient are stored in the multi-valued memory cells, and the interaction calculation circuit 330 can determine the next state of the spin by the interaction calculation using the multiple values. Therefore, it is possible to handle the calculations of more complex problems, and solutions of the problems can be obtained at higher speed.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, the embodiments above have been described in detail so as to make the present invention easily understood, and the present invention is not limited to the embodiment having all of the described constituent elements. Also, the configuration of one embodiment may be added to the configuration of another embodiment, and a part of the configuration of each embodiment may be eliminated or replaced with another configuration.

Also, in the description of the embodiment above, the Ising model which is globally typical in physics has been taken as an example. However, the present invention is not limited to this, and it can be applied to overall interaction models which can express various physical phenomena and social phenomena.

FIG. 1
100 ISING CHIP
160 INTERACTION CONTROL INTERFACE
130 I/O ADDRESS DECODER
110 SPIN ARRAY
140 INTERACTION ADDRESS DECODER
120 I/O DRIVER
150 SRAM COMPATIBLE INTERFACE
FIG. 2
200 INFORMATION PROCESSING DEVICE
230 SYSTEM BUS
250 ISING-CHIP CONTROLLER
100-1 ISING CHIP
FIG. 3
300 SPIN UNIT
FIG. 4
300 SPIN UNIT
FIG. 6
FLASH MEMORY
330 INTERACTION CALCULATION CIRCUIT
FIG. 12
320 FLASH MEMORY
330 INTERACTION CALCULATION CIRCUIT
500 READ CIRCUIT
FIG. 13
COEFFICIENT VALUE
510 FLASH-MEMORY READ/WRITE CIRCUIT
FIG. 14
320 FLASH MEMORY
610 INTERACTION CALCULATION CIRCUIT
600 READ CIRCUIT
FIG. 15
RESULT OF INTERACTION CALCULATION
620 FLASH-MEMORY READ/WRITE CIRCUIT/INTERACTION CALCULATION CIRCUIT
FIG. 16
START INTERACTION OPERATION
S701 INTERACTION CALCULATION OF SPIN UNITS N00, N11 AND N22
S702 INTERACTION CALCULATION OF SPIN UNITS N10, N21 AND N03
S703 INTERACTION CALCULATION OF SPIN UNITS N20, N02 AND N13
S704 INTERACTION CALCULATION OF SPIN UNITS N01, N12 AND N23
S705 INTERACTION HAS BEEN CARRIED OUT PREDETERMINED NUMBER OF TIMES?
END OF OPERATION

What is claimed is:
1. A semiconductor device comprising:
a plurality of units, each of which includes a first memory cell that stores a value indicating a state of one node of an interaction model, a second memory cell that stores an interaction coefficient indicating an interaction from a node connected to the one node, and a third memory cell that stores a bias coefficient of the one node; and a computing circuit that determines a value indicating a next state of the one node based on a value indicating a state of the connected node, the interaction coefficient and the bias coefficient, wherein each of the second memory cell and the third memory cell in the plurality of units includes multi-valued memory cells, wherein the interaction coefficient stored in the second memory cell and the bias coefficient stored in the third memory cell are stored in the memory cells of the multi-valued memory, and wherein each of the plurality of units further includes:

a read circuit that reads the interaction coefficient and the bias coefficient stored in the memory cells of the multi-valued memory; and the computing circuit that determines the value indicating the next state of the one node based on the value indicating the state of the connected node, the interaction coefficient from the read circuit, and the bias coefficient from the read circuit.

2. The semiconductor device according to claim 1, wherein the computing circuit is disposed inside the unit, and wherein the multi-valued memory cells are memory cells of a flash memory.

3. The semiconductor device according to claim 2, wherein the read circuit is disposed inside the unit.

4. The semiconductor device according to claim 3, wherein the read circuit is shared by the plurality of units.

5. The semiconductor device according to claim 1, wherein the computing circuit is disposed outside the unit, the multi-valued memory cells are memory cells of a flash memory, and the read circuit is disposed outside the unit.

6. The semiconductor device according to claim 5, wherein the read circuit and the computing circuit are shared by the plurality of units.

7. A semiconductor device comprising:

a plurality of units, each of which includes a first memory cell that stores a value indicating a state of one node of an interaction model, a second memory cell that stores an interaction coefficient indicating an interaction from a node connected to the one node, and a third memory cell that stores a bias coefficient of the one node; and a computing circuit that determines a value indicating a next state of the one node based on a value indicating a state of the connected node, the interaction coefficient and the bias coefficient, wherein each of the second memory cell and the third memory cell in the plurality of units includes multi-valued memory cells, wherein the computing circuit includes:

a logic circuit that carries out interaction calculation of a first side and a second side based on the value indicating the state of the connected node, the interaction coefficient and the bias coefficient; and a comparison circuit that compares magnitude of actions of the first side and the second side based on a result of the logic circuit and outputs a first value of the first side or a second value of the second side as the value indicating the next state of the one node.

8. The semiconductor device according to claim 7, wherein the multi-valued memory cells are memory cells of a flash memory, and wherein the logic circuit includes:

a first calculating circuit that is made up of a plurality of parallel-connected current paths of a plurality of memory cells respectively storing the value indicating the state of the connected node, the interaction coefficient and the bias coefficient, and calculates the magnitude of the action of the first side; and a second calculating circuit that is made up of a plurality of parallel-connected current paths of a plurality of memory cells respectively storing the value indicating the state of the connected node, the interaction coefficient and the bias coefficient, and calculates the magnitude of the action of the second side, and the comparison circuit compares a voltage of a first common line in which a result of the first calculating circuit appears and a voltage of a second common line in which a result of the second calculating circuit appears and outputs the first value or the second value corresponding to a higher voltage as the value indicating the next state of the one node.

9. An information processing device in which a CPU, a RAM, a HDD and a semiconductor device operable as an accelerator are connected via a system bus, wherein the semiconductor device includes:

a plurality of units, each of which includes a first memory cell that stores a value indicating a state of one node of an interaction model, a second memory cell that stores an interaction coefficient indicating an interaction from a node connected to the one node, and a third memory cell that stores a bias coefficient of the one node;

a computing circuit that determines a value indicating a next state of the one node based on a value indicating a state of the connected node, the interaction coefficient and the bias coefficient;

an I/O interface that reads/writes the memory cells of the plurality of units; and an interaction control interface that supplies a signal allowing the interaction to the plurality of units, each of the second memory cell and the third memory cell in the plurality of units includes multi-valued memory cells, and a control program of the semiconductor device executed on the CPU writes the value indicating the state of the node to the first memory cell, writes the interaction coefficient to the second memory cell of the multi-valued memory cell, and writes the bias coefficient to the third memory cell of the multi-valued memory cell for each of the plurality of units on the semiconductor device to which the nodes of the interaction model expressing a target problem are allocated, repeatedly executes a ground state searching process of the plurality of units a predetermined number of times, and reads the value indicating the state of the node of the plurality of units that has reached a ground state to obtain a solution of the target problem.

10. The information processing device according to claim 9, wherein the plurality of units are grouped, and the ground state searching process of the plurality of units is repeatedly executed a predetermined number of times for each group of the units.

11. The information processing device according to claim 9, wherein the multi-valued memory cells are memory cells of a flash memory, and to the memory cells of the flash memory, a numerical value of the interaction coefficient and a numerical value of the bias coefficient are written, or the numerical value and a sign of the interaction coefficient and the numerical value and a sign of the bias coefficient are written.

* * * * *